(12) United States Patent
Baek et al.

(10) Patent No.: US 11,439,003 B2
(45) Date of Patent: Sep. 6, 2022

(54) ANTENNA MODULE INCLUDING PRINTED CIRCUIT BOARD AND BASE STATION INCLUDING THE ANTENNA MODULE

(71) Applicant: Samsung Electronics Co., Ltd., Suwon-si (KR)

(72) Inventors: Kwanghyun Baek, Suwon-si (KR); Juneseok Lee, Suwon-si (KR); Dohyuk Ha, Suwon-si (KR); Junsig Kum, Suwon-si (KR); Kijoon Kim, Suwon-si (KR); Youngju Lee, Suwon-si (KR); Jungyub Lee, Suwon-si (KR); Jinsu Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 92 days.

(21) Appl. No.: 16/844,590

(22) Filed: Apr. 9, 2020

(65) Prior Publication Data
US 2020/0329556 A1    Oct. 15, 2020

(30) Foreign Application Priority Data
Apr. 12, 2019 (KR) .................. 10-2019-0043136

(51) Int. Cl.
*H01Q 1/22* (2006.01)
*H05K 1/02* (2006.01)
(Continued)

(52) U.S. Cl.
CPC ......... *H05K 1/0243* (2013.01); *H01Q 1/2283* (2013.01); *H01Q 1/50* (2013.01);
(Continued)

(58) Field of Classification Search
CPC ............ H01Q 1/22; H01Q 23/00; H01Q 1/38; H05K 2201/10098; H05K 3/429
See application file for complete search history.

(56) References Cited

U.S. PATENT DOCUMENTS 6,518,932 B1    2/2003   Matsui et al.
9,196,951 B2   11/2015   Baks et al.
(Continued)

FOREIGN PATENT DOCUMENTS

EP    1152485 A1    11/2001

OTHER PUBLICATIONS

European Search Report in connection with European Application No. 20169136.7 dated Jul. 14, 2020, 9 pages.
(Continued)

*Primary Examiner* — Hasan Islam

(57) ABSTRACT

The present disclosure relates to a communication method and system for converging a $5^{th}$-Generation (5G) communication system for supporting higher data rates beyond a $4^{th}$-Generation (4G) system with a technology for Internet of Things (IoT). The present disclosure may be applied to intelligent services based on the 5G communication technology and the IoT-related technology, such as smart home, smart building, smart city, smart car, connected car, health care, digital education, smart retail, security and safety services. An antenna module and a base station including the antenna module. The antenna module includes a printed circuit board in which at least one layer is stacked, a feeding unit disposed at one surface of the printed circuit board, and a first antenna spaced apart from the feeding unit by a predetermined first length.

16 Claims, 22 Drawing Sheets

(51) Int. Cl.
    *H01Q 1/50*         (2006.01)
    *H01Q 9/04*         (2006.01)
    *H05K 1/18*         (2006.01)
    *H05K 3/42*         (2006.01)
    *H01Q 23/00*       (2006.01)

(52) U.S. Cl.
    CPC ........... H01Q 9/0457 (2013.01); H05K 1/184 (2013.01); H05K 1/189 (2013.01); H05K 3/429 (2013.01); *H01Q 23/00* (2013.01); *H05K 2201/0195* (2013.01); *H05K 2201/10098* (2013.01)

(56) References Cited

U.S. PATENT DOCUMENTS

| | | |
|---|---|---|
| 9,391,370 B2 | 7/2016 | Tzanidis et al. |
| 2014/0145883 A1 | 5/2014 | Baks et al. |
| 2014/0184455 A1 | 7/2014 | Lea et al. |
| 2015/0194730 A1* | 7/2015 | Sudo ............... H01Q 5/378 343/905 |
| 2019/0020114 A1* | 1/2019 | Paulotto ............ H01Q 9/0442 |
| 2019/0113609 A1* | 4/2019 | Baheti ............... H01Q 1/2283 |
| 2019/0237879 A1* | 8/2019 | Park ................. H01Q 1/243 |
| 2020/0106192 A1* | 4/2020 | Avser ............... H01Q 1/38 |
| 2021/0014960 A1* | 1/2021 | Sakurai ............. H05K 1/0242 |

OTHER PUBLICATIONS

Risto Valkonen, "Compact 28-GHz phased array antenna for 5G access", 2018 IEEE/MTT-S International Microwave Symposium, Jun. 2018, p. 1334-1337.

* cited by examiner

ANTENNA MODULE INCLUDING PRINTED CIRCUIT BOARD AND BASE STATION INCLUDING THE ANTENNA MODULE

CROSS-REFERENCE TO RELATED APPLICATION

This application is based on and claims priority under 35 U.S.C. 119 to Korean Patent Application No. 10-2019-0043136 filed on Apr. 12, 2019 in the Korean Intellectual Property Office, the disclosure of which is herein incorporated by reference in its entirety.

BACKGROUND

1. Field

The disclosure provides an antenna module including a printed circuit board and a base station including the antenna module.

2. Description of Related Art

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, Machine Type Communication (MTC), and Machine-to-Machine (M2M) communication may be implemented by beamforming, MIMO, and array antennas. Application of a cloud Radio Access Network (RAN) as the above-described Big Data processing technology may also be considered to be as an example of convergence between the 5G technology and the IoT technology.

In the case of an antenna module including a printed circuit board, a performance of the antenna module may have an influence on a production process of the printed circuit board. For example, as the stacking number of layers required for fabrication of a printed circuit board increases, the performance of the antenna module may decrease, and when producing the antenna module, a failure rate of the antenna module may increase.

SUMMARY

The disclosure has been made in view of the above problems and provides an antenna module including a printed circuit board and a base station including the antenna module.

According to various embodiments of the disclosure, an antenna module including a printed circuit board may include the printed circuit board in which at least one layer is stacked; a feeding unit disposed at one surface of the printed circuit board; and a first antenna spaced apart from the feeding unit by a predetermined first length.

According to various embodiments of the disclosure, there is provided a base station including an antenna module, wherein the antenna module includes a printed circuit board in which at least one layer is stacked; a feeding unit disposed at one surface of the printed circuit board; and a first antenna spaced apart from the feeding unit by a predetermined first length.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
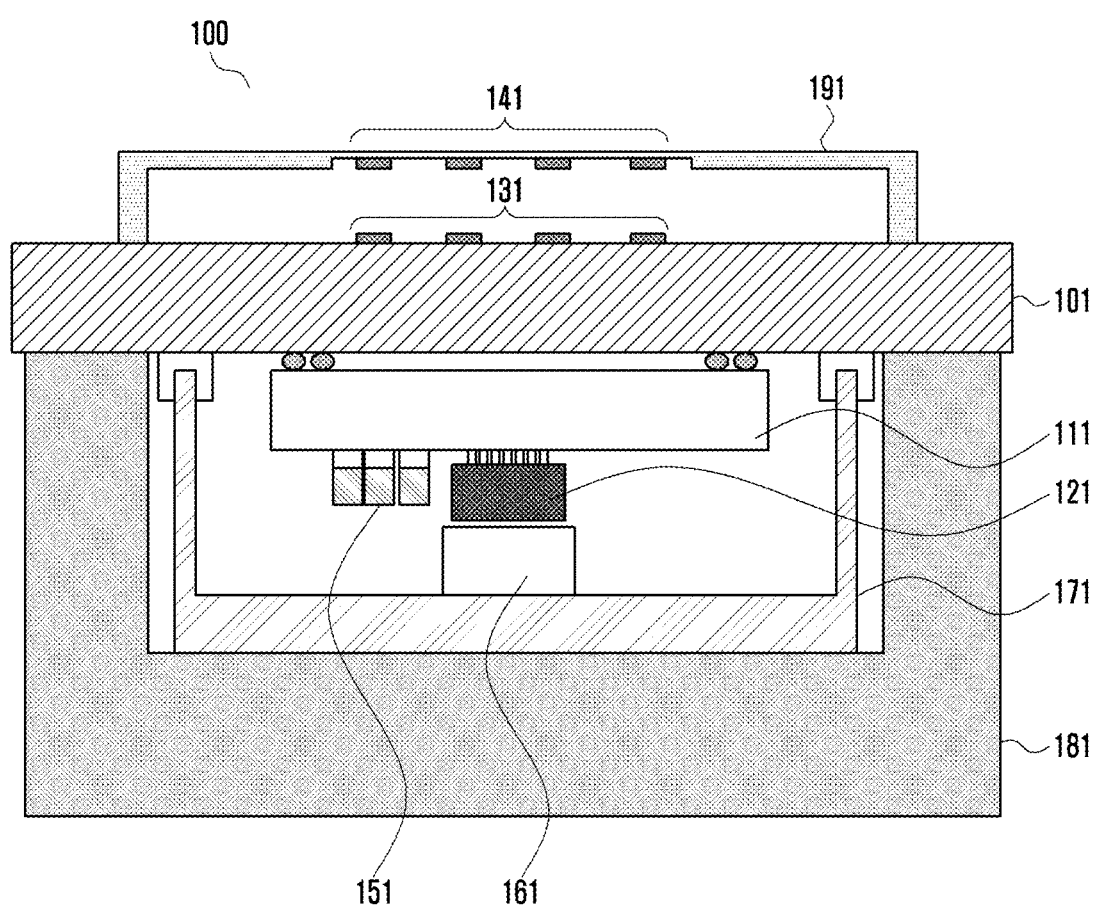
FIG. 1 is a diagram illustrating an antenna module structure according to an embodiment.

FIGS. 1 through 13, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

When describing an embodiment in this specification, a description of technical contents well known in the art of the disclosure and not directly related to the disclosure will be omitted. This is to clearly describe the subject matter of the disclosure, without obscuring the subject matter, by omitting any unnecessary description.

Similarly, in the attached drawings, some constituent elements are shown in an exaggerated or schematic form or are omitted. Further, a size of each constituent element does not entirely reflect an actual size. Like reference numerals designate like elements in the drawings.

These advantages and features of the disclosure and a method of accomplishing them will become more readily apparent from the detailed description given hereinafter together with the accompanying drawings. However, the disclosure is not limited to the following embodiments, and it may be implemented in different forms. The present embodiments enable the complete disclosure of the disclosure and are provided to enable complete knowledge of the scope of the disclosure to those skilled in the art, and the disclosure is defined by the scope of the claims. Like reference numerals designate like elements throughout the specification.

Herein, it may be understood that each block of a flowchart and combinations of the flowchart may be performed by computer program instructions. Because these computer program instructions may be mounted in a processor of a universal computer, a special computer, or other programmable data processing equipment, the instructions performed through a processor of a computer or other programmable data processing equipment generate a means that performs functions described in a block(s) of the flowchart. In order to implement a function with a specific method, because these computer program instructions may be stored at a computer available or computer readable memory that can direct a computer or other programmable data processing equipment, instructions stored at the computer available or computer readable memory may produce a production item including an instruction means that performs a function described in block(s) of the flowchart. Because computer program instructions may be mounted on a computer or other programmable data processing equipment, a series of operation steps are performed on the computer or other programmable data processing equipment and generate a process executed with the computer, and instructions that direct the computer or other programmable data processing equipment may provide steps for executing functions described in block(s) of the flowchart.

Further, each block may represent a portion of a module, segment, or code including at least one executable instruction for executing a specific logical function(s). Further, in several replaceable execution examples, it should be noted that functions described in blocks may be performed regardless of order. For example, two consecutively shown blocks may be substantially simultaneously performed or may be sometimes performed in reverse order according to a corresponding function.

In this case, a term '-unit' used in the present embodiment means a software or hardware component such as a field programmable gate array (FPGA) or an application specific integrated circuit (ASIC) and performs any function. However, "-unit" is not limited to software or hardware. The "-unit" may be configured to store at a storage medium that can address and be configured to reproduce at least one processor. Therefore, "-unit" includes, for example, components such as software components, object-oriented software components, class components, and task components, processes, functions, attributes, procedures, subroutines, segments of a program code, drivers, firmware, microcode, circuit, data, database, data structures, tables, arrays, and variables. A function provided within constituent elements and "-units" may be performed by coupling the smaller number of constituent elements and "-units" or by subdividing the constituent elements and "-units" into additional constituent elements and "-units". Further, constituent elements and "-units" may be implemented in a manner to reproduce at least one CPU within a device or a security multimedia card. Further, in an embodiment, '-unit' may include at least one processor.

FIG. 1 is a diagram illustrating an antenna module structure according to an embodiment.

According to an embodiment, an antenna module 100 may include a first substrate layer 101 on which at least one substrate is stacked, at least one first antenna 131 disposed at an upper end surface of the first substrate layer 101, a second substrate layer 111 having an upper end surface coupled to a lower end surface of the first substrate layer 101 and in which at least one substrate is stacked, and a wireless communication chip 121 coupled to a lower end surface of the second substrate layer 111.

According to an embodiment, the first substrate layer 101 and the second substrate layer 111 mean a substrate in which a circuit is formed and may generally include a printed circuit board (PCB) and a printed wiring board (PWB). According to various embodiments, the first substrate layer 101 and the second substrate layer 111 may form a circuit for connecting each circuit component on a surface or the inside of the substrate based on a designed circuit.

According to an embodiment, the first substrate layer 101 to which at least one first antenna 131 is coupled may be a main board of the antenna module according to the disclosure. At least one first antenna 131 and another circuit component (e.g., wireless communication chip) may be electrically connected to each other through a wire formed in the first substrate layer 101.

According to an embodiment, at an upper end surface of the first substrate layer 101, at least one first antenna 131 may be disposed. For example, as illustrated in FIG. 1, four first antennas 131 may be spaced apart at regular intervals to be disposed at the upper end surface of the first substrate layer 101.

In an embodiment, at an upper end surface of the first substrate layer 101, a cover 191 may be disposed. For example, the cover 191 may be made of plastic and enclose at least one first antenna disposed at an upper end surface of the first substrate layer 101. According to various embodiments, at least one second antenna 141 may be disposed at one surface of the cover 191 facing the at least one first antenna 131. For example, the at least one second antenna 141 may be disposed to correspond to the at least one first antenna 131.

According to an embodiment, the at least one first antenna 131 and the at least one second antenna 141 may be configured as a patch antenna. According to various embodiments, the antenna module may include the at least one first antenna 131 and the at least one second antenna 141, thereby enhancing a gain value or coverage.

According to an embodiment, the second substrate layer 111 is a substrate layer for a circuit wiring between the wireless communication chip 121 and other circuit components. According to various embodiments, a plurality of substrates may also be stacked on the second substrate layer 111. According to an embodiment, the number of substrates stacked on the second substrate layer 111 may be smaller than that of substrates stacked on the first substrate layer 101.

According to an embodiment, a grid array may be formed at a lower end surface of the first substrate layer 101, and the first substrate layer 101 and the second substrate layer 111 may be electrically connected through the grid array. According to various embodiments, the grid array may include a land grid array (LGA) or a ball grid array (BGA).

According to an embodiment, at least one capacitor 151 may be disposed at a lower end surface of the second substrate layer 111. The noise generated in the circuit disposed at the second substrate layer 111 may be removed through the at least one capacitor 151, thereby improving stability of the antenna module. For example, the at least one capacitor 151 may be a capacitor of a surface mount device (SMD) type.

According to an embodiment, the antenna module may include a shield can 171 coupled to a lower end surface of the first substrate layer 101 to enclose the second substrate layer 111 and the wireless communication chip 121. According to various embodiments, the shield can 171 may shield electromagnetic waves generated in the second substrate layer 111 and the wireless communication chip 121. For example, the shield can 171 may be coupled to a lower end surface of the first substrate layer 101 through a shield can clip.

According to an embodiment, the wireless communication chip 121 may be a wireless communication chip in which a wireless communication circuit is implemented on one semiconductor chip by using an active element and a passive element. According to various embodiments, a heat may be generated by an operation of the wireless communication chip 121, and performance degradation of the wireless communication chip 121 may occur by the heat generation. According to an embodiment, a heat interface material 161 (TIM) may be disposed between the wireless communication chip 121 and the shield can 171 to radiate a heat generated in the wireless communication chip 121 to the outside of the antenna module.

According to an embodiment, a heat generated in the wireless communication chip 121 may be transferred to the shield can 171 through the heat interface material 161, and the heat transferred to the shield can 171 may be transferred to a radiator 181 coupled to a lower end surface of the first substrate layer 101 and a lower end surface of the shield can 171 to be radiated to the outside of the antenna module.

Figure 2:
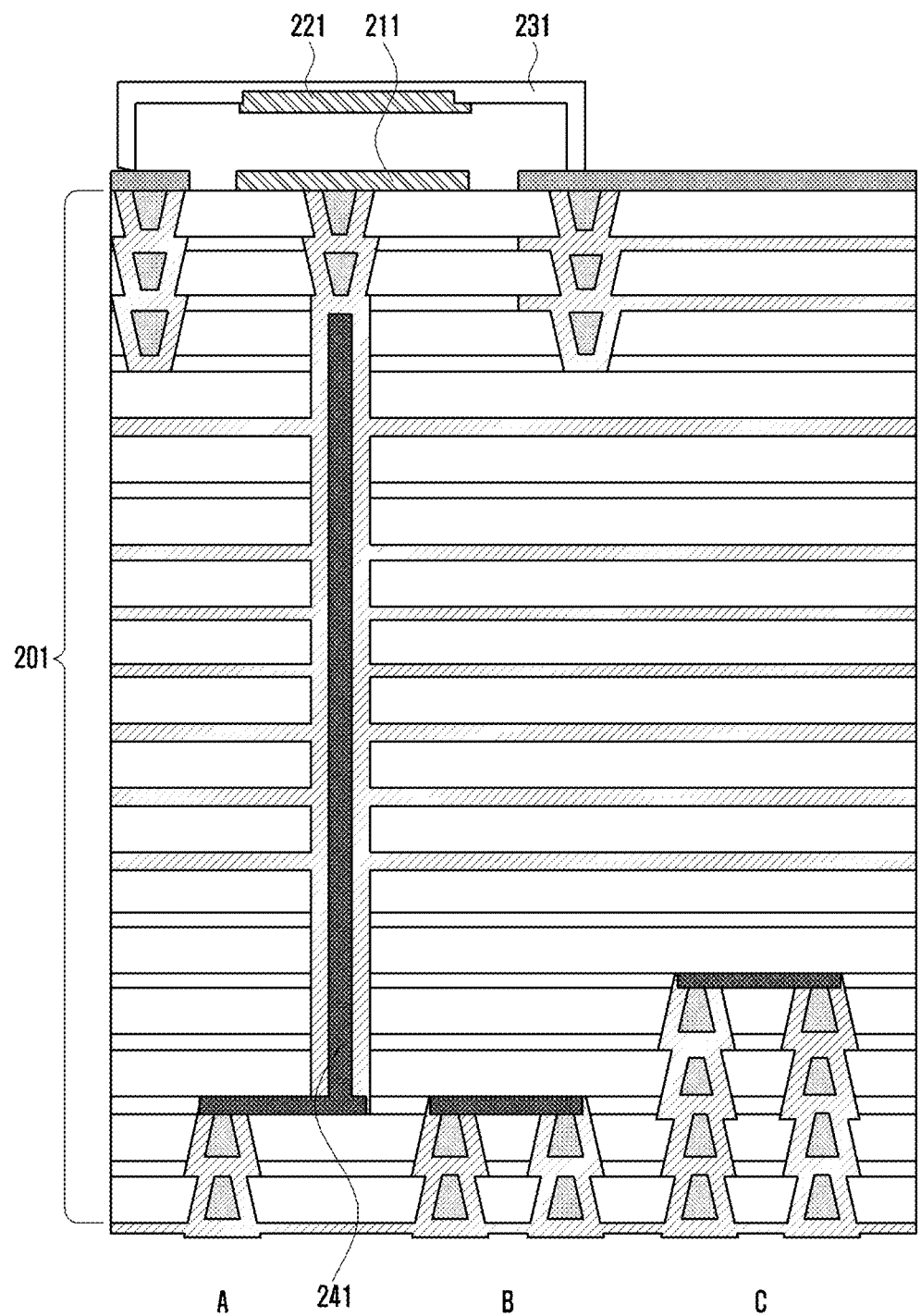
FIG. 2 is a side view illustrating an antenna module structure according to an embodiment.

FIG. 2 is a side view illustrating an antenna module structure according to an embodiment.

According to an embodiment, the antenna module may include a printed circuit board 201 in which a plurality of layers are stacked. For example, the printed circuit board 201 may be formed by stacking 18 layers. According to various embodiments, in each layer of the printed circuit board 201, a via hole may be formed. For example, the printed circuit board 201 may include a via hole by a laser process and a via hole 241 by a PTH process.

According to an embodiment, at one surface of the printed circuit board 201, a first antenna 211 for radiating radio waves may be disposed. For example, at a first layer stacked on an upper end surface of the printed circuit board 201, the first antenna 211 may be disposed. According to various embodiments, a via hole by a laser process may be formed in the first layer, and the first antenna 211 may receive an electrical signal for radiating radio waves through the via hole.

According to an embodiment, a via hole by a laser process may be formed in a second layer and a third layer disposed under a first layer (in the stacking direction) disposed at the upper end surface of the printed circuit board 201. According to various embodiments, a ground may be disposed at one surface of the third layer.

According to an embodiment, an electrical signal for generating a radio frequency may be supplied to the other surface of the printed circuit board 201. For example, in order to generate a radio frequency, a basic signal for generating a radio frequency, an intermediate frequency signal and a local frequency signal for changing a frequency of the basic signal may be used, and the basic signal, the intermediate frequency signal, and the local frequency signal may be supplied to the other surface of the printed circuit board 201.

According to an embodiment, the basic signal may be supplied through A disposed at the other surface of the printed circuit board 201. According to various embodiments, the basic signal supplied through A may be transmitted to the first antenna 211 disposed at one surface of the printed circuit board 201 through a via hole formed in the printed circuit board.

According to an embodiment, the intermediate frequency signal may be supplied through B disposed at the other surface of the printed circuit board 201. According to various embodiments, the intermediate frequency signal supplied through B may be transmitted to the printed circuit board through a via hole formed in the printed circuit board. For example, the intermediate frequency signal may be transmitted to one surface of the third layer through a via hole formed in a second layer disposed at the other surface of the printed circuit board and a third layer disposed over the second layer. According to an embodiment, the basic signal supplied through A may also be transmitted to one surface of the third layer through via holes formed in the second layer and the third layer. According to various embodiments, a power supply line for electrically connecting the via hole 241 formed by a PTH process and the via hole formed by the laser process may be formed at one surface of the third layer.

According to an embodiment, the local frequency signal may be supplied through C disposed at the other surface of the printed circuit board 201. According to various embodiments, the local frequency signal supplied through C may be transmitted to the printed circuit board through a via hole formed in the printed circuit board. For example, the local frequency signal may be transmitted to one surface of a fifth layer through via holes disposed at the fifth layer and a fourth layer disposed over the third layer.

According to an embodiment, a feed line for the intermediate frequency signal and a feed line for the local frequency signal may be formed in different layers. With reference to the foregoing example, the feed line for the intermediate frequency signal may be formed at one surface of the third layer, and the feed line for the local frequency signal may be formed at one surface of the fifth layer.

According to an embodiment, a cover 231 for protecting the first antenna 211 from an external impact may be disposed at one surface of the printed circuit board 201. According to various embodiments, the cover 231 may be plastic, and have a shape enclosing the first antenna 211. According to an embodiment, a second antenna 221 may be disposed at one surface of the cover 231 facing the first antenna 211. According to various embodiments, by controlling a separation distance between the first antenna 211 and the second antenna 221, a performance of the antenna module can be improved.

Figure 3:
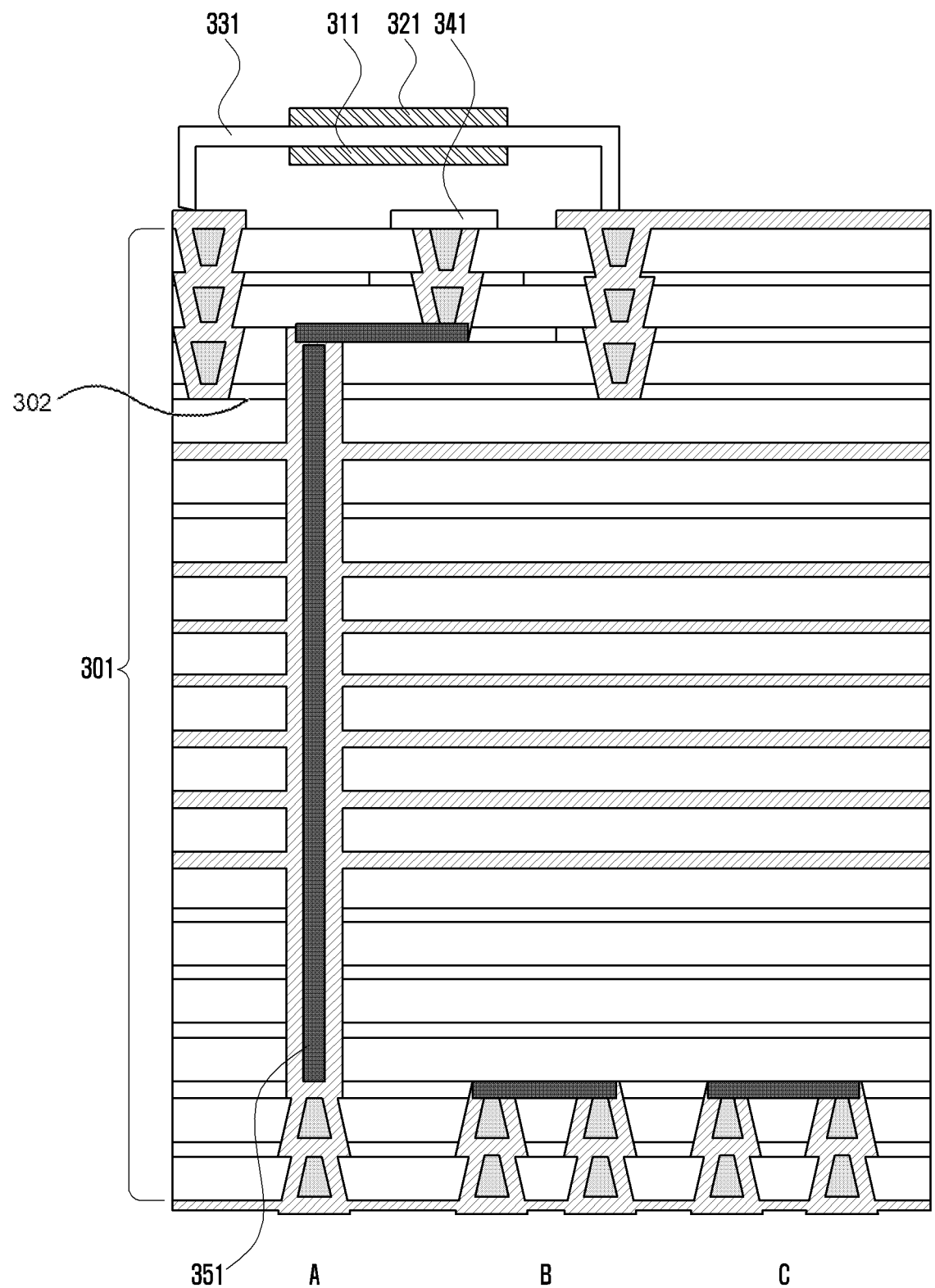
FIG. 3 is a side view illustrating an antenna module structure according to the disclosure.

FIG. 3 is a side view illustrating an antenna module structure according to the disclosure.

According to an embodiment, an antenna module may include a printed circuit board 301 in which a plurality of layers are stacked. For example, the printed circuit board 301 may be formed by stacking 18 layers. According to various embodiments, each layer of the printed circuit board 301 may have via holes. For example, the printed circuit board 301 may include a via hole by a laser process and a via hole 351 by a PTH process.

According to an embodiment, at one surface of the printed circuit board 301, a feeding unit 341 for supplying an electrical signal for radiating radio waves may be disposed. For example, the feeding unit 341 may be disposed at a first layer stacked on an upper end surface of the printed circuit board 301. According to various embodiments, a via hole by a laser process may be formed in the first layer, and the feeding unit 341 may receive an electrical signal for radiating radio waves through the via hole.

According to an embodiment, a via hole by a laser process may be formed in a second layer and a third layer disposed under (in a stacking direction) the first layer disposed at the upper end surface of the printed circuit board 301. According to various embodiments, a ground 302 may be disposed at one surface of the third layer.

According to an embodiment, an electrical signal for generating a radio frequency may be supplied to the other surface of the printed circuit board 301. For example, in order to generate a radio frequency, a basic signal for generating a radio frequency, an intermediate frequency signal and a local frequency signal for changing a frequency of the basic signal may be used, and the basic signal, the intermediate frequency signal, and the local frequency signal may be supplied to the other surface of the printed circuit board 301.

According to an embodiment, the basic signal may be supplied through A disposed at the other surface of the printed circuit board 301. According to various embodiments, the basic signal supplied through A may be transmitted to the feeding unit 341 disposed at one surface of the printed circuit board 301 through a via hole formed in the printed circuit board 301.

According to an embodiment, the intermediate frequency signal may be supplied through B disposed at the other surface of the printed circuit board 301. According to various embodiments, the intermediate frequency signal supplied through B may be transmitted to the printed circuit board 301 through a via hole formed in the printed circuit board 301. For example, the intermediate frequency signal may be transmitted to one surface of a third layer through a via hole formed in a second layer disposed at the other surface of the printed circuit board 301 and the third layer disposed over the second layer. According to an embodiment, the basic signal supplied through A may also be transmitted to one surface of the third layer through via holes formed in the second layer and the third layer.

According to an embodiment, the local frequency signal may be supplied through C disposed at the other surface of the printed circuit board 301. According to various embodiments, the local frequency signal supplied through C may be transmitted to the printed circuit board 301 through a via hole formed in the printed circuit board 301. For example, the local frequency signal may be transmitted to one surface of the third layer through via holes formed in the second layer and the third layer in the same manner as that of the intermediate frequency signal.

According to an embodiment, a feed line for the intermediate frequency signal and a feed line for the local frequency signal may be formed in the same layer. With reference to the above example, the feed line for the intermediate frequency signal and the feed line for the local frequency may be formed at one surface of the third layer.

According to an embodiment, according to the antenna module structure illustrated in FIG. 3, the stacking number of layers may be three times upon producing the printed circuit board 301. For example, in the antenna module structure illustrated in FIG. 3, by stacking once layers from a third layer to a sixteenth layer in a direction of an upper end surface of the printed circuit board, by stacking once a second layer and a seventeenth layer in a direction of the upper end surface of the printed circuit board, and by stacking a first layer and an eighteenth layer in a direction of the upper end surface of the printed circuit board, the printed circuit board 301 may be produced. According to the above-described antenna module structure illustrated in FIG. 2, the stacking number of layers may be five times upon producing the printed circuit board 301. Therefore, according to the disclosure, a production process of the printed circuit board constituting the antenna module can be simplified.

According to an embodiment, a cover 331 for disposing an antenna may be coupled to one surface of the printed circuit board 301. According to various embodiments, a first antenna 311 for receiving electric signals from the feeding unit 341 to radiate radio waves may be disposed at one surface of the cover 331 facing the feeding unit 341. That is, according to the antenna module structure disclosed in the disclosure, the first antenna 311 and the feeding unit 341 may have a coupling structure that is not directly connected.

According to an embodiment, because the feeding unit 341 and the first antenna 311 are not directly connected, the antenna may be freely disposed in the antenna module. That is, according to the antenna module structure disclosed in the disclosure, design freedom of the antenna module can be improved.

According to an embodiment, a second antenna 321 may be disposed at the other surface of the cover 331. According to various embodiments, the first antenna 311 and the second antenna 321 may be spaced apart by a predetermined length by the cover 331 made of a non-metallic material. According to an embodiment, a performance of the antenna module may be determined based on a separation distance between the first antenna 311 and the second antenna 321.

Figure 4:
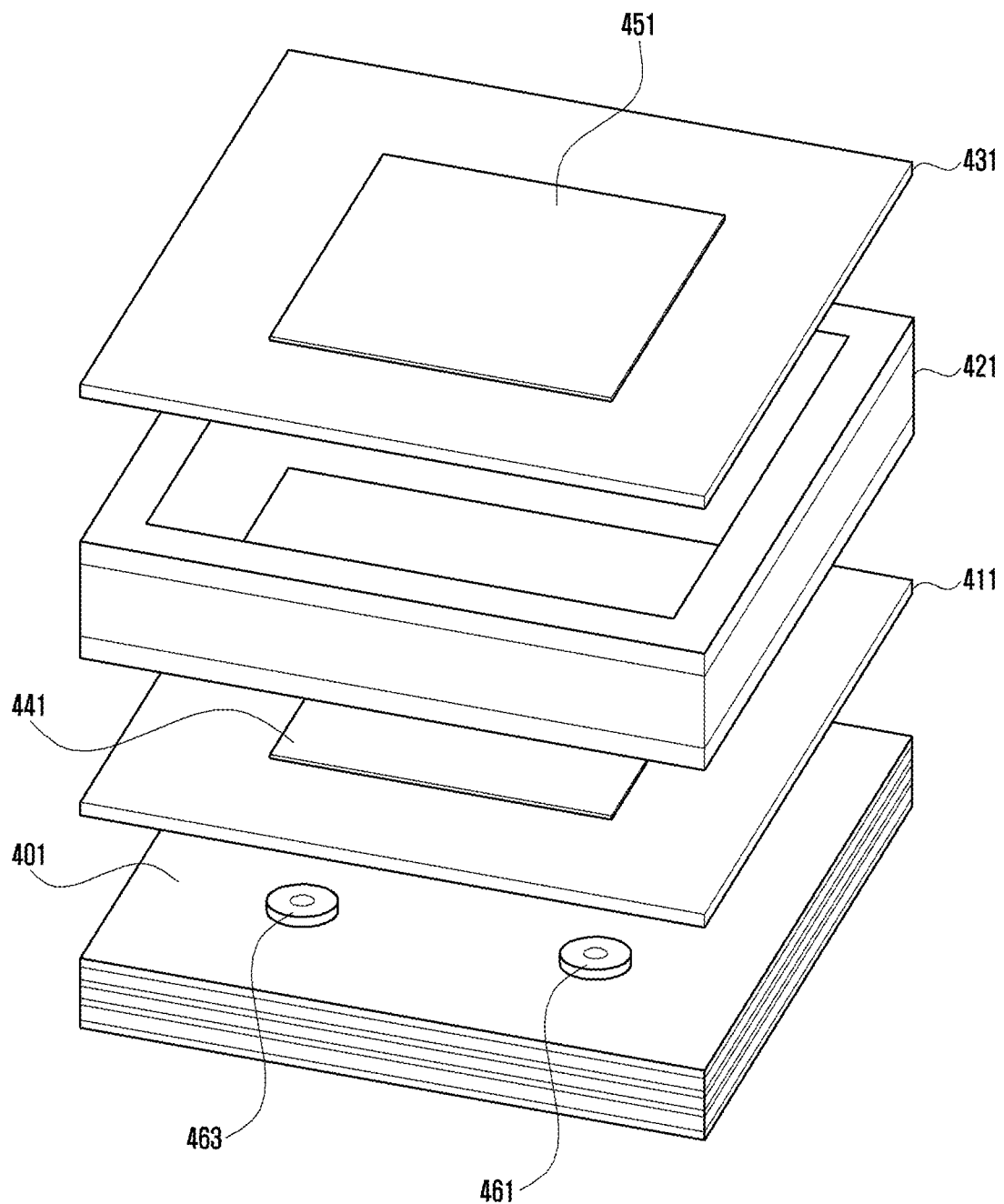
FIG. 4 is an exploded view illustrating an antenna module structure according to the disclosure.

FIG. 4 is an exploded view illustrating an antenna module structure according to the disclosure.

According to an embodiment, an antenna module may include a first printed circuit board 401 on which at least one layer is stacked. According to various embodiments, at least one feeding unit 461 and 463 may be disposed at an upper end surface of the first printed circuit board 401. FIG. 4 illustrates a case where the first feeding unit 461 and the second feeding unit 463 are disposed at the upper end surface of the first printed circuit board 401.

According to an embodiment, the first feeding unit 461 and the second feeding unit 463 may receive an electrical signal for radiating a radio wave from a wireless communication chip (not illustrated) disposed at a lower end surface of the first printed circuit board 401 through via holes formed in each layer of the first printed circuit board 401. According to various embodiments, the electrical signal may be an electrical signal for emitting radio waves of a mmWave band used in 5G mobile communication. For example, the electrical signal may be an electrical signal for radiating radio waves having a frequency of 28 GHz or 39 GHz.

According to an embodiment, a second printed circuit board 411 including a first antenna 441 may be disposed at an upper end surface of the first printed circuit board 401. According to various embodiments, the second printed circuit board 411 may include a flexible printed circuit board (FPCB).

According to an embodiment, the first antenna 441 may be disposed at an upper end surface of the second printed circuit board 411. According to various embodiments, the first antenna 441 may be spaced apart from the first feeding unit 461 and the second feeding unit 463 by the second printed circuit board 411.

According to an embodiment, a structure 421 having a specific shape may be disposed at an upper end surface of the second printed circuit board 411. According to various embodiments, the structure 421 may have a barrier shape and be made of a non-metallic material. For example, the structure 421 may be made of plastic.

According to an embodiment, a third printed circuit board 431 including a second antenna 451 may be disposed at an upper end surface of the structure 421. According to various embodiments, the third printed circuit board 431 may include a FPCB. According to an embodiment, the third printed circuit board 431 may be spaced apart from the second printed circuit board 411 through the structure 421. According to various embodiments, the structure 421, the second printed circuit board 411, and the third printed circuit board 431 may be coupled to each other through an adhesive.

Figure 5A:
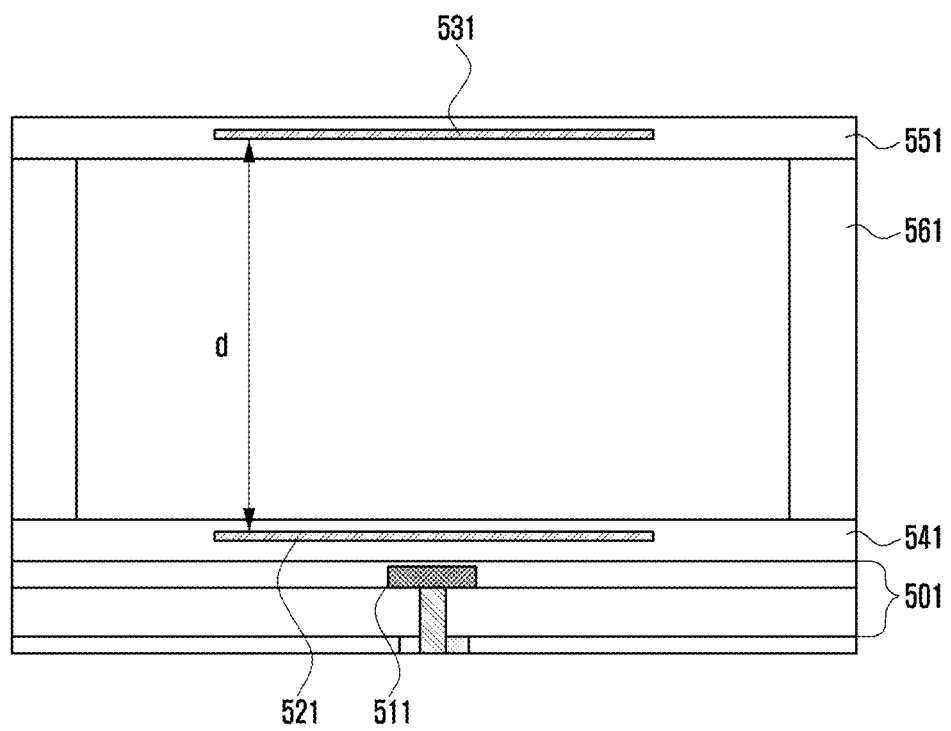
FIG. 5A is a diagram illustrating a separation length between a first antenna and a second antenna in an antenna module structure according to the disclosure.

FIG. 5A is a diagram illustrating a separation length between a first antenna and a second antenna in an antenna module structure according to the disclosure.

According to an embodiment, the antenna module may include a first printed circuit board 501 including a feeding unit 511. According to various embodiments, at an upper end surface of the first printed circuit board 501, a second printed circuit board 541 including a first antenna 521 may be disposed. According to an embodiment, a third printed circuit board 551 including a second antenna 531 may be spaced apart from the second printed circuit board 541 by a structure 561 made of a non-metallic material.

According to an embodiment, an impedance value of the antenna module may be changed based on a separation length d between the first antenna 521 and the second antenna 531. According to various embodiments, the separation length d between the first antenna 521 and the second antenna 531 may be determined based on a wavelength of radio waves to be emitted through the antenna module. For example, the separation distance d between the first antenna 521 and the second antenna 531 may have a value of 0.05λ to 0.08λ (λ is a wavelength of radio waves radiated through the antenna module.).

Figure 5B:
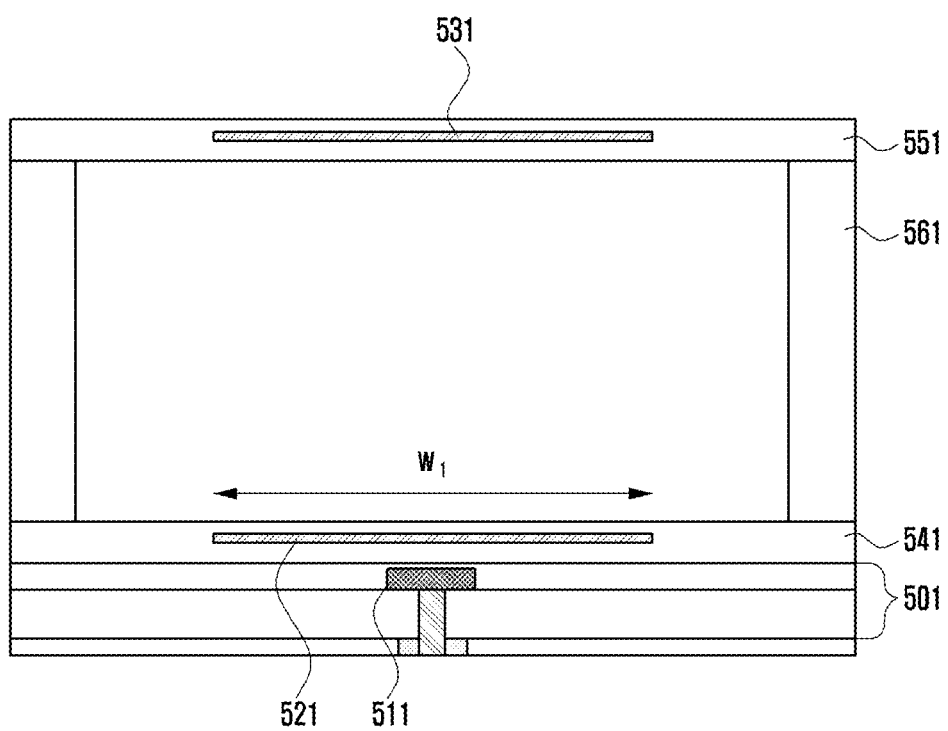
FIG. 5B is a diagram illustrating a size of a first antenna in an antenna module structure according to the disclosure.

FIG. 5B is a diagram illustrating a size of a first antenna in an antenna module structure according to the disclosure.

According to an embodiment, an antenna module may include a first printed circuit board 501 including a feeding unit 511. According to various embodiments, a second printed circuit board 541 including a first antenna 521 may be disposed at an upper end surface of the first printed circuit board 501. According to an embodiment, a third printed circuit board 551 including a second antenna 531 may be spaced apart from the second printed circuit board 541 by a structure 561 made of a non-metallic material.

According to an embodiment, an impedance value of the antenna module may be changed based on a size $w_1$ of the first antenna 521. According to various embodiments, the size $w_1$ of the first antenna 521 may be determined based on a wavelength of radio waves to be emitted through the antenna module. For example, when the first antenna 521 and the second antenna 531 have a circular shape and a diameter of the second antenna 531 is 0.273λ, a diameter $w_1$ of the first antenna 521 may have a value of 0.23λ, to 0.34λ, (λ is a wavelength of radio waves radiated through the antenna module.).

Figure 5C:
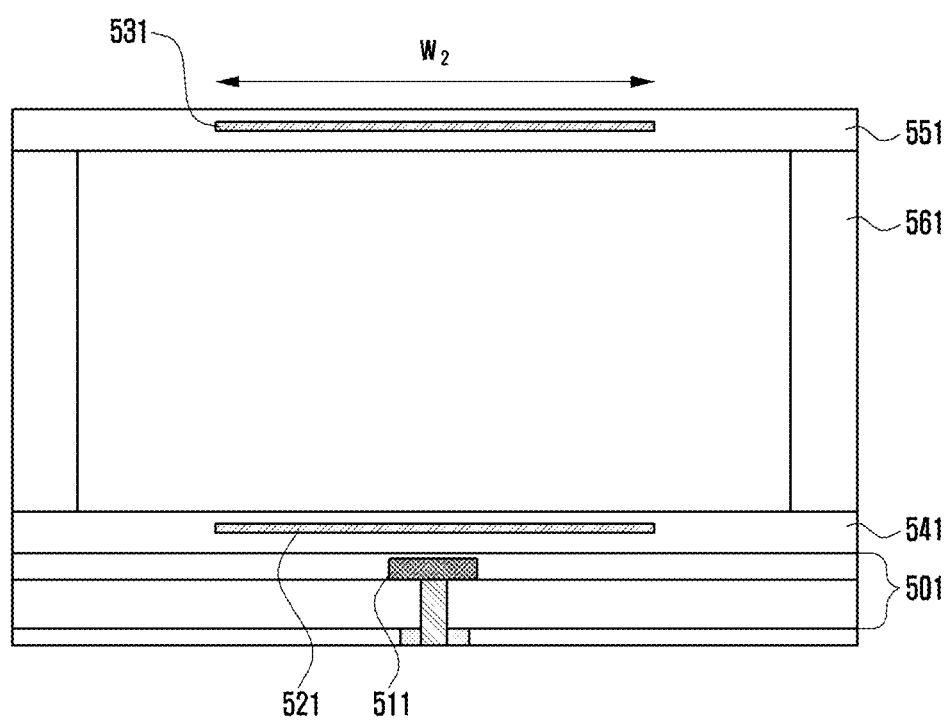
FIG. 5C is a diagram illustrating a size of a second antenna in an antenna module structure according to the disclosure.

FIG. 5C is a diagram illustrating a size of a second antenna in an antenna module structure according to the disclosure.

According to an embodiment, an antenna module may include a first printed circuit board 501 including a feeding unit 511. According to various embodiments, at an upper end surface of the first printed circuit board 501, a second printed circuit board 541 including a first antenna 521 may be disposed. According to an embodiment, a third printed circuit board 551 including a second antenna 531 may be spaced apart from the second printed circuit board 541 by a structure 561 made of a non-metallic material.

According to an embodiment, an impedance value of the antenna module may be changed based on a size $w_2$ of the second antenna 531. According to various embodiments, the size $w_2$ of the second antenna 531 may be determined based on a wavelength of radio waves to be emitted through the antenna module. For example, when the first antenna 521 and the second antenna 531 have a circular shape and a diameter of the first antenna 521 is 0.273λ, a diameter $w_2$ of the second antenna 531 may have a value of 0.2λ to 0.32λ (λ is a wavelength of radio waves radiated through the antenna module.).

Figure 5D:
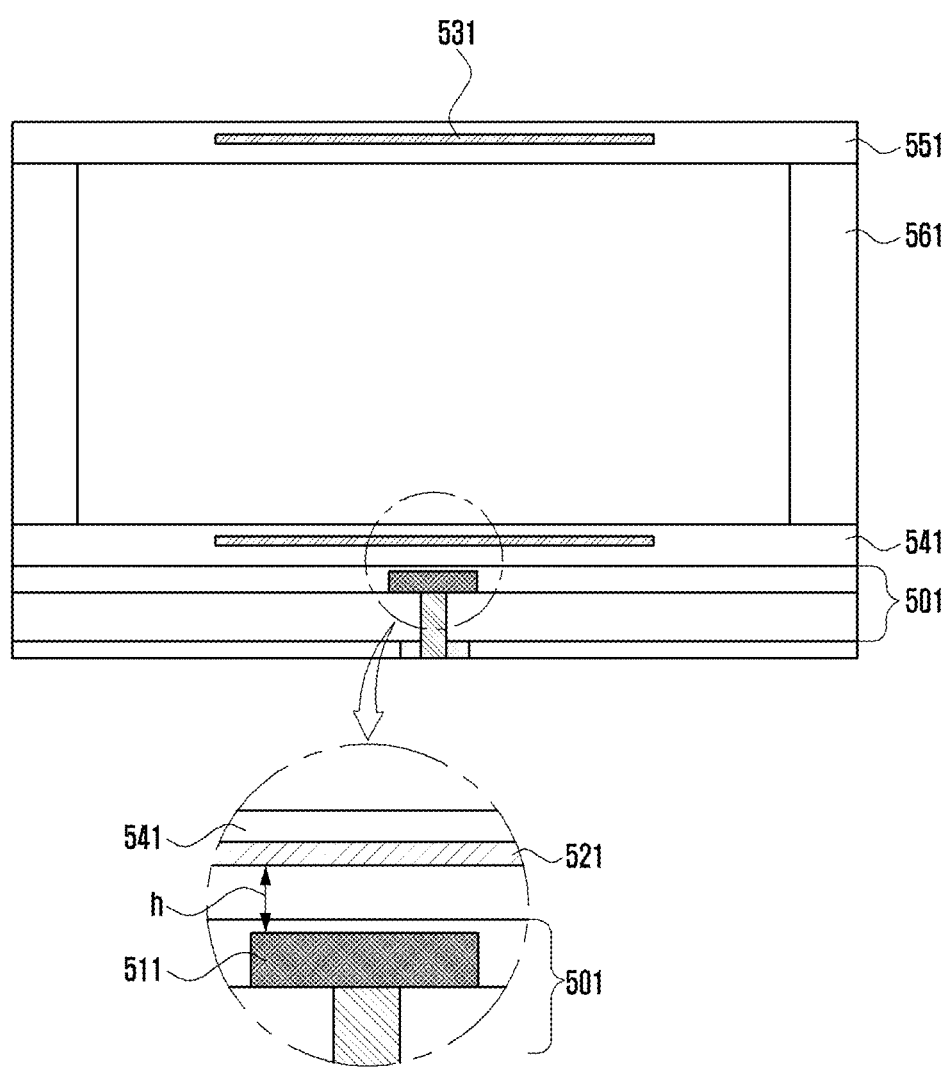
FIG. 5D is a diagram illustrating a separation length between a feeding unit and a first antenna in an antenna module structure according to the disclosure.

FIG. 5D is a diagram illustrating a separation length between a feeding unit and a first antenna in an antenna module structure according to the disclosure.

According to an embodiment, the antenna module may include a first printed circuit board 501 including a feeding unit 511. According to various embodiments, at an upper end surface of the first printed circuit board 501, a second printed circuit board 541 including a first antenna 521 may be disposed. According to an embodiment, a third printed circuit board 551 including a second antenna 531 may be spaced apart from the second printed circuit board 541 by a structure 561 made of a non-metallic material.

According to an embodiment, an impedance value of the antenna module may be changed based on a separation length h between the first antenna 521 and the feeding unit 511. According to various embodiments, the separation length h between the first antenna 521 and the feeding unit 511 may be determined based on a wavelength of radio waves to be emitted through the antenna module. For example, the separation length h between the first antenna 521 and the feeding unit 511 may have a value of 0.2λ to 0.32λ (λ is a wavelength of radio waves radiated through the antenna module.).

Figure 5E:
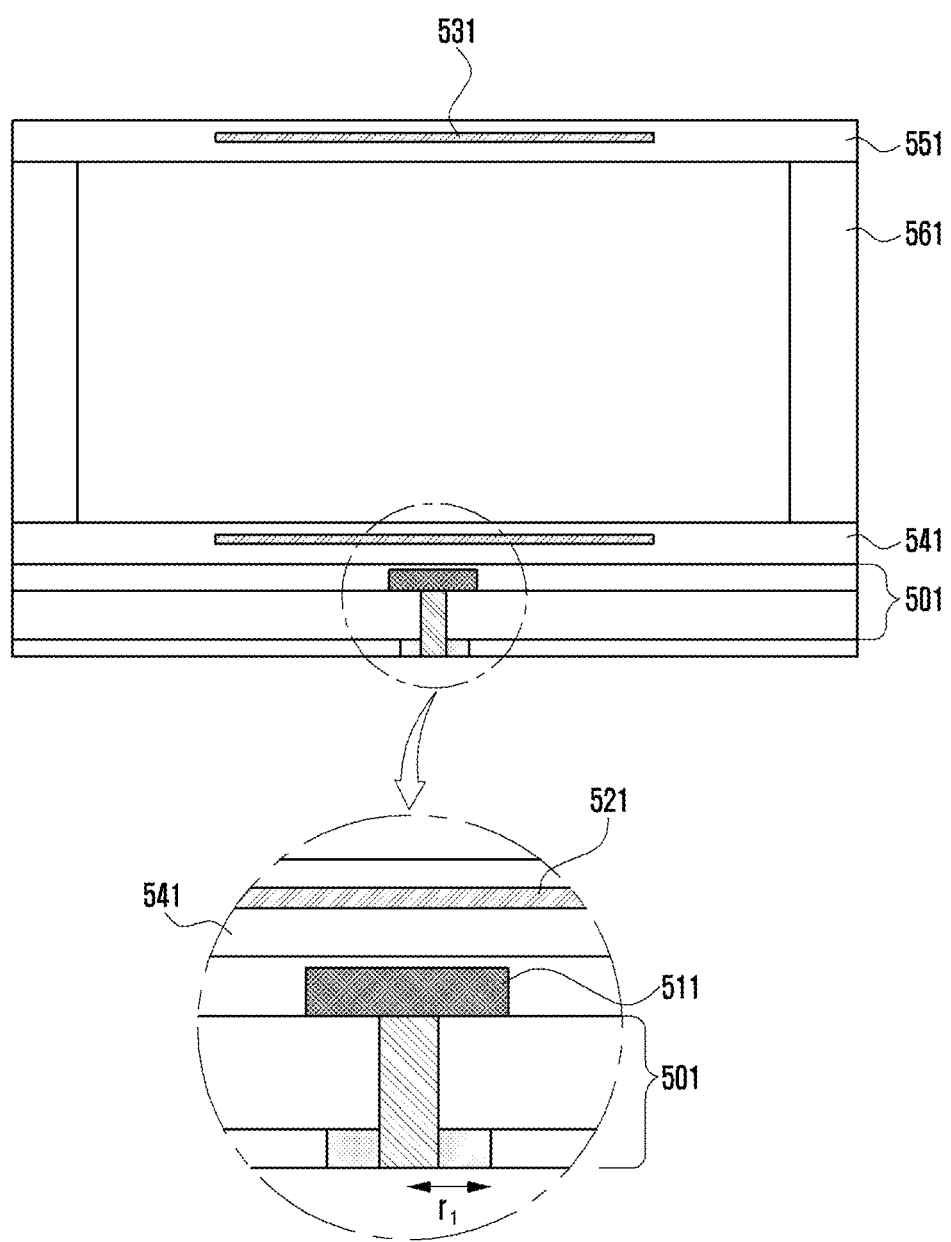
FIG. 5E is a diagram illustrating a length of a feeding unit anti-pad in an antenna module structure according to the disclosure.

FIG. 5E is a diagram illustrating a length of a feeding unit anti-pad in an antenna module structure according to the disclosure.

According to an embodiment, an antenna module may include a first printed circuit board 501 including a feeding unit 511. According to various embodiments, at an upper end surface of the first printed circuit board 501, a second printed circuit board 541 including a first antenna 521 may be disposed. According to an embodiment, a third printed circuit board 551 including a second antenna 531 may be spaced apart from the second printed circuit board 541 by a structure 561 made of a non-metallic material.

According to an embodiment, an impedance value of the antenna module may be changed based on a size $r_1$ of an anti-pad of the feeding unit 511. According to various embodiments, the size $r_1$ of the anti-pad of the feeding unit 511 may be determined based on a wavelength of radio waves to be emitted through the antenna module. For example, when the anti-pad of the feeding unit 511 has a circular shape, a radius $r_1$ of the anti-pad of the feeding unit 511 may have a value of 0.02λ to 0.08λ (λ is a wavelength of radio waves radiated through the antenna module.).

Figure 5F:
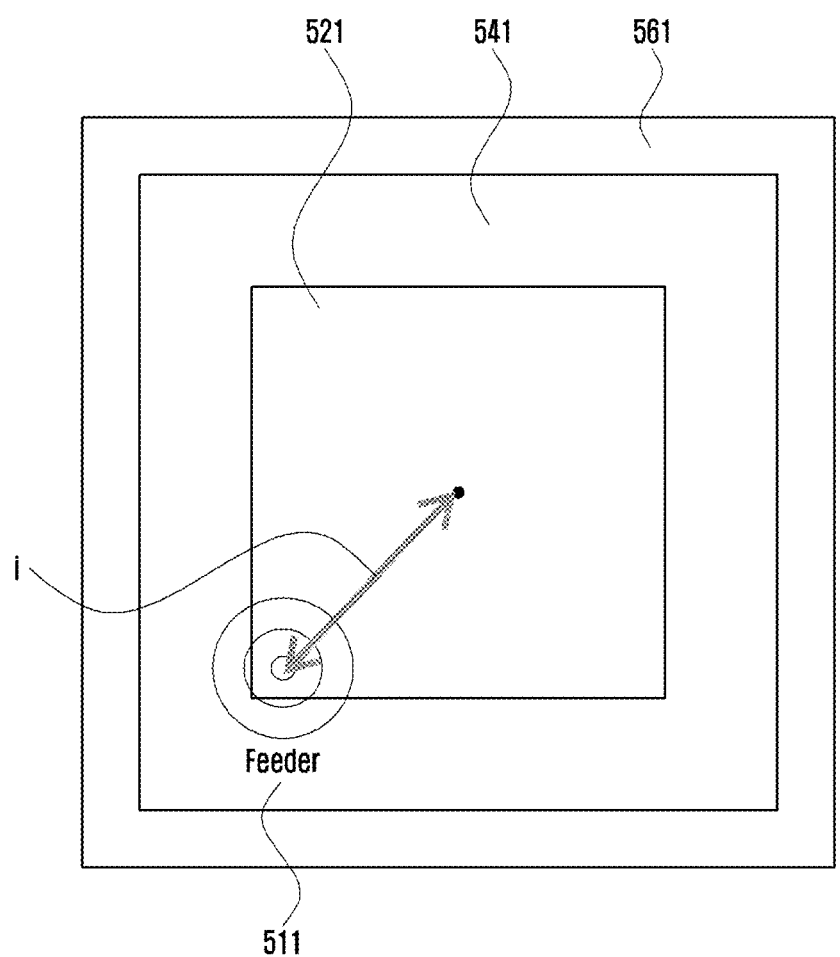
FIG. 5F is a diagram illustrating a distance between the antenna center and the center of a feeding unit in an antenna module structure according to the disclosure.

FIG. 5F is a diagram illustrating a distance between the antenna center and the center of a feeding unit in an antenna module structure according to the disclosure.

According to an embodiment, the antenna module may include a first printed circuit board 501 including a feeding unit 511. According to various embodiments, at an upper end surface of the first printed circuit board 501, a second printed circuit board 541 including a first antenna 521 may be disposed. According to an embodiment, a third printed circuit board 551 including the second antenna 531 may be spaced apart from the second printed circuit board 541 by a structure 561 made of a non-metallic material.

According to an embodiment, an impedance value of the antenna module may be changed based on a separation length i between the center of the first antenna 521 and the feeding unit 511. According to various embodiments, the separation length i between the center of the first antenna 521 and the feeding unit 511 may be determined based on a wavelength of radio waves to be emitted through the antenna module. For example, the separation length i between the center of the first antenna 521 and the feeding unit 511 may have a value of 0.07λ to 1.7λ (λ is a wavelength of radio waves radiated through the antenna module.).

Figure 5G:
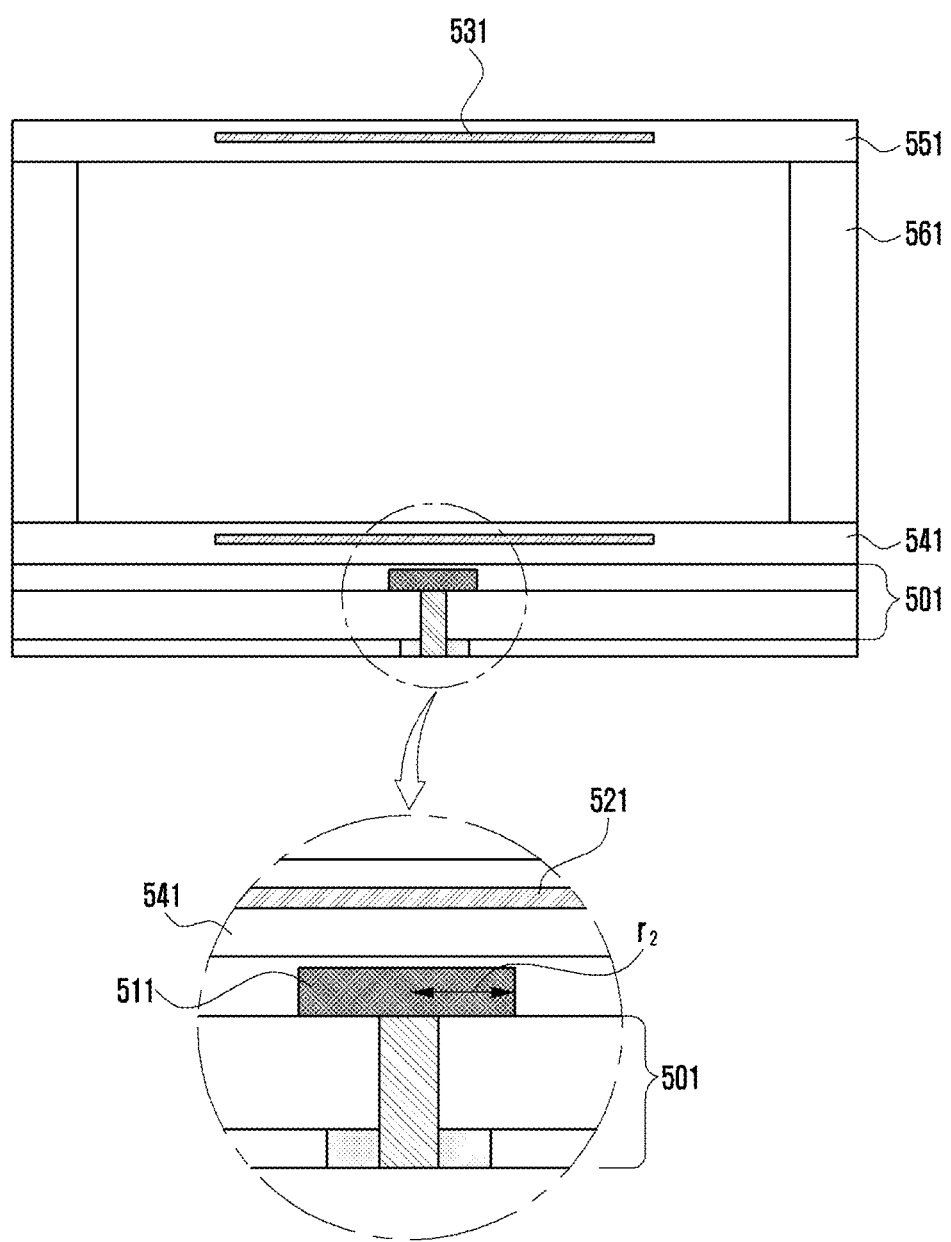
FIG. 5G is a diagram illustrating a length of a feeding unit in an antenna module structure according to the disclosure.

FIG. 5G is a diagram illustrating a length of a feeding unit in an antenna module structure according to the disclosure.

According to an embodiment, an antenna module may include a first printed circuit board 501 including a feeding unit 511. According to various embodiments, at an upper end surface of the first printed circuit board 501, a second printed circuit board 541 including a first antenna 521 may be disposed. According to an embodiment, a third printed circuit board 551 including a second antenna 531 may be spaced apart from the second printed circuit board 541 by a structure 561 made of a non-metallic material.

According to an embodiment, an impedance value of the antenna module may be changed based on a length $r_2$ of the feeding unit 511. According to various embodiments, the length $r_2$ of the feeding unit 511 may be determined based on a wavelength of radio waves to be emitted through the antenna module. For example, when the feeding unit 511 has a circular shape, a radius $r_2$ of the feeding unit 511 may have a value of $0.01\lambda$ to $0.08\lambda$ ($\lambda$ is a wavelength of radio waves radiated through the antenna module.).

Figure 6A:
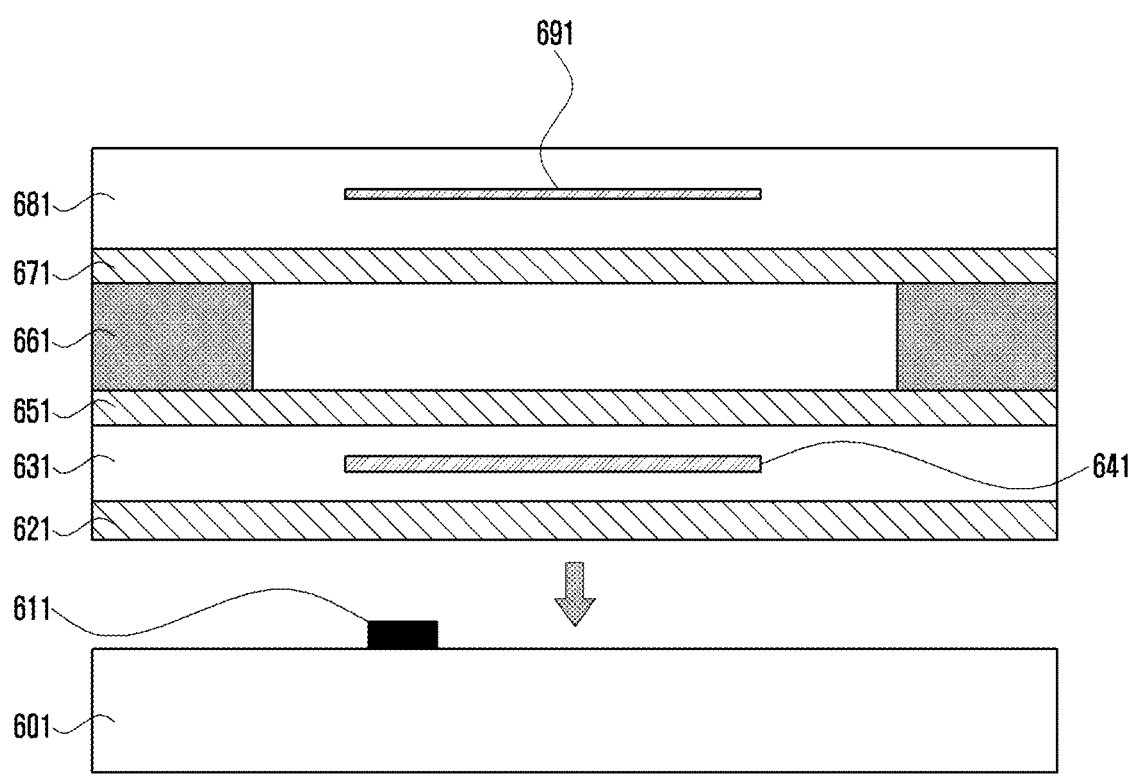
FIG. 6A is a diagram illustrating an antenna module production process according to an embodiment disclosed in the disclosure.

FIG. 6A is a diagram illustrating an antenna module production process according to an embodiment disclosed in the disclosure.

According to an embodiment, an antenna module may be configured with a first area including a printed circuit board 601 and a second area including a first antenna 641 and a second antenna 691. According to various embodiments, the first area may include a printed circuit board 601 and a power supply pad 611 disposed at an upper end surface of the printed circuit board 601.

According to an embodiment, the first area may be coupled to the second area through a first adhesive layer 621 disposed at a lower end surface of the second area. According to various embodiments, the first adhesive layer 621 may be disposed at a lower end surface of the second area, and a first layer 631 including the first antenna 641 may be disposed over the first adhesive layer 621. For example, the first layer 631 may include a layer made of a dielectric body.

According to an embodiment, a structure 661 produced in a predetermined shape may be disposed at an upper end surface of the first layer 631. According to various embodiments, at an upper end surface of the structure 661, a second layer 681 including the second antenna 691 may be disposed. According to an embodiment, a separation distance between the first antenna 641 included in the first layer 631 and the second antenna 691 included in the second layer 681 may be maintained by the structure 661. According to various embodiments, the structure 661 and the first layer 631 may be coupled through a second adhesive layer 651 disposed at an upper end surface of the first layer 631, and the structure 661 and the second layer 681 may be coupled through a third adhesive layer 671 disposed at a lower end surface of the second layer 681.

According to an embodiment, an antenna module production process may be performed in this manner in which the first area and the second area are separately produced and in which the first area and the second area are coupled to each other by the first adhesive layer 621 disposed at the lower end surface of the second area.

Figure 6B:
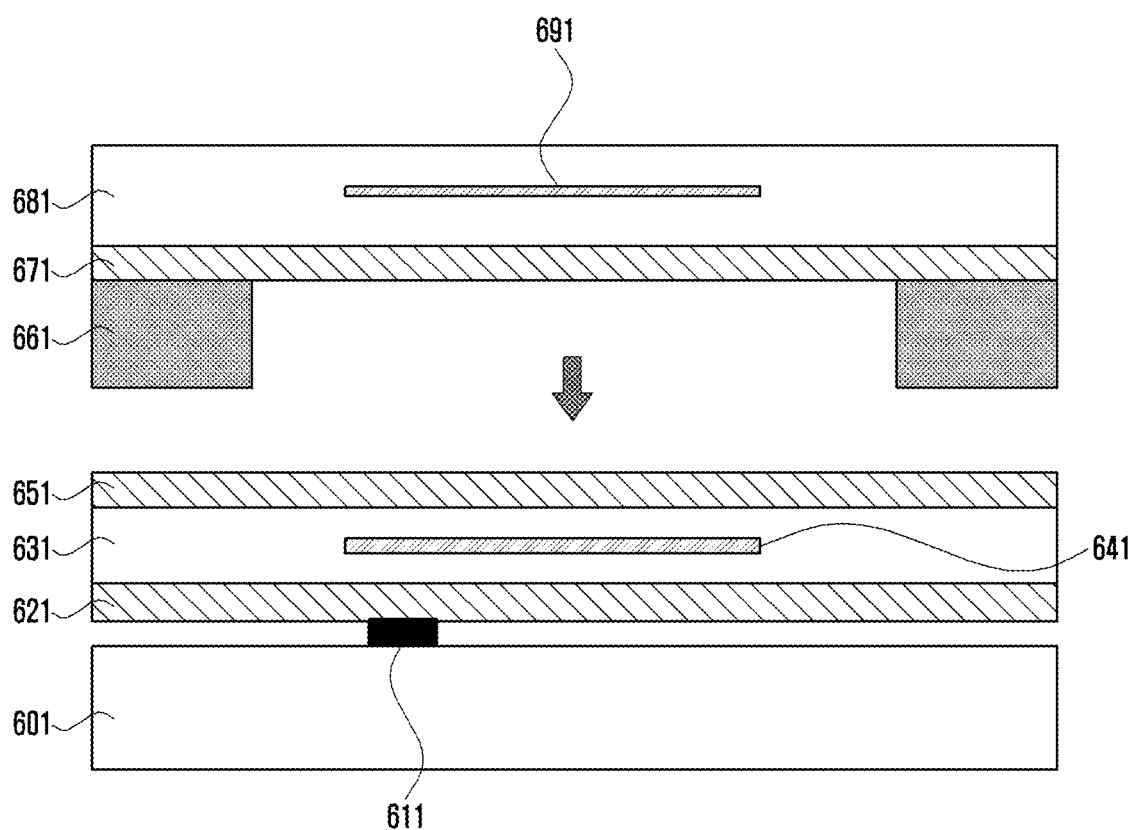
FIG. 6B is a diagram illustrating an antenna module production process according to an embodiment disclosed in the disclosure.

FIG. 6B is a diagram illustrating an antenna module production process according to an embodiment disclosed in the disclosure.

According to an embodiment, an antenna module may be configured with a first area including a first antenna 641 and a second area including a second antenna 691. According to various embodiments, the first area may include a printed circuit board 601, a power supply pad 611 disposed at an upper end surface of the printed circuit board 601, and a first layer 631 disposed at an upper end surface of the printed circuit board 601.

According to an embodiment, the printed circuit board 601 and the first layer 631 may be coupled to each other through a first adhesive layer 621 disposed at a lower end surface of the first layer 631. According to various embodiments, the first layer 631 may include a layer made of a dielectric body.

According to an embodiment, the second area may include a structure 661 and a second layer 681 disposed at an upper end surface of the structure 661 and including the second antenna 691. According to various embodiments, the structure 661 may be made of a non-metallic material, and the structure 661 and the second layer 681 may be coupled through a third adhesive layer 671 disposed at a lower end surface of the second layer 681.

According to an embodiment, the first area and the second area may be coupled through a second adhesive layer 651 disposed at an upper end surface of the first layer 631. According to various embodiments, when the first area and the second area are coupled, a separation distance between the first antenna 641 included in the first layer 631 and the second antenna 691 included in the second layer 681 may be maintained by the structure 661.

According to an embodiment, an antenna module production process may be performed in this manner in which the first area and the second area are separately produced and in which the first area and the second area are coupled to each other by the second adhesive layer 651 disposed at an upper end surface of the first area.

Figure 6C:
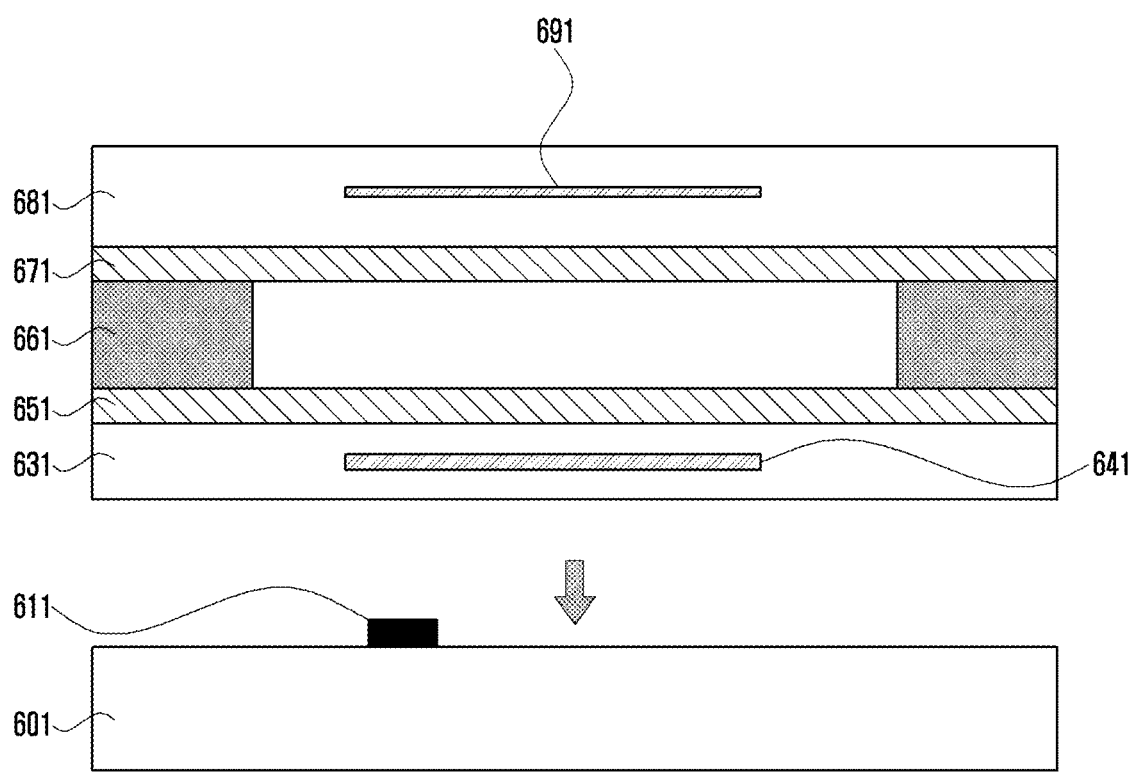
FIG. 6C is a diagram illustrating an antenna module production process according to an embodiment disclosed in the disclosure.

FIG. 6C is a diagram illustrating an antenna module production process according to an embodiment disclosed in the disclosure.

According to an embodiment, an antenna module may be configured with a first area including a printed circuit board 601 and a second area including a first antenna 641 and a second antenna 691. According to various embodiments, the first area may include a printed circuit board 601 and a power supply pad 611 disposed at an upper end surface of the printed circuit board 601.

According to an embodiment, a first layer 631 disposed at a lower end surface of the second area may be stacked on an upper end surface of the printed circuit board 601 constituting the first area. According to various embodiments, the first layer 631 may include a first antenna 641, and the first layer 631 may include a layer made of a dielectric body.

According to an embodiment, at an upper end surface of the first layer 631, a structure 661 produced in a predetermined shape may be disposed. According to various embodiments, at an upper end surface of the structure 661, a second layer 681 including the second antenna 691 may be disposed. According to an embodiment, a separation distance between the first antenna 641 included in the first layer 631 and the second antenna 691 included in the second layer 681 may be maintained by the structure 661. According to various embodiments, the structure 661 and the first layer 631 may be coupled through a second adhesive layer 651 disposed at an upper end surface of the first layer 631, and the structure 661 and the second layer 681 may be coupled through a third adhesive layer 671 disposed at a lower end surface of the second layer 681.

Figure 7A:
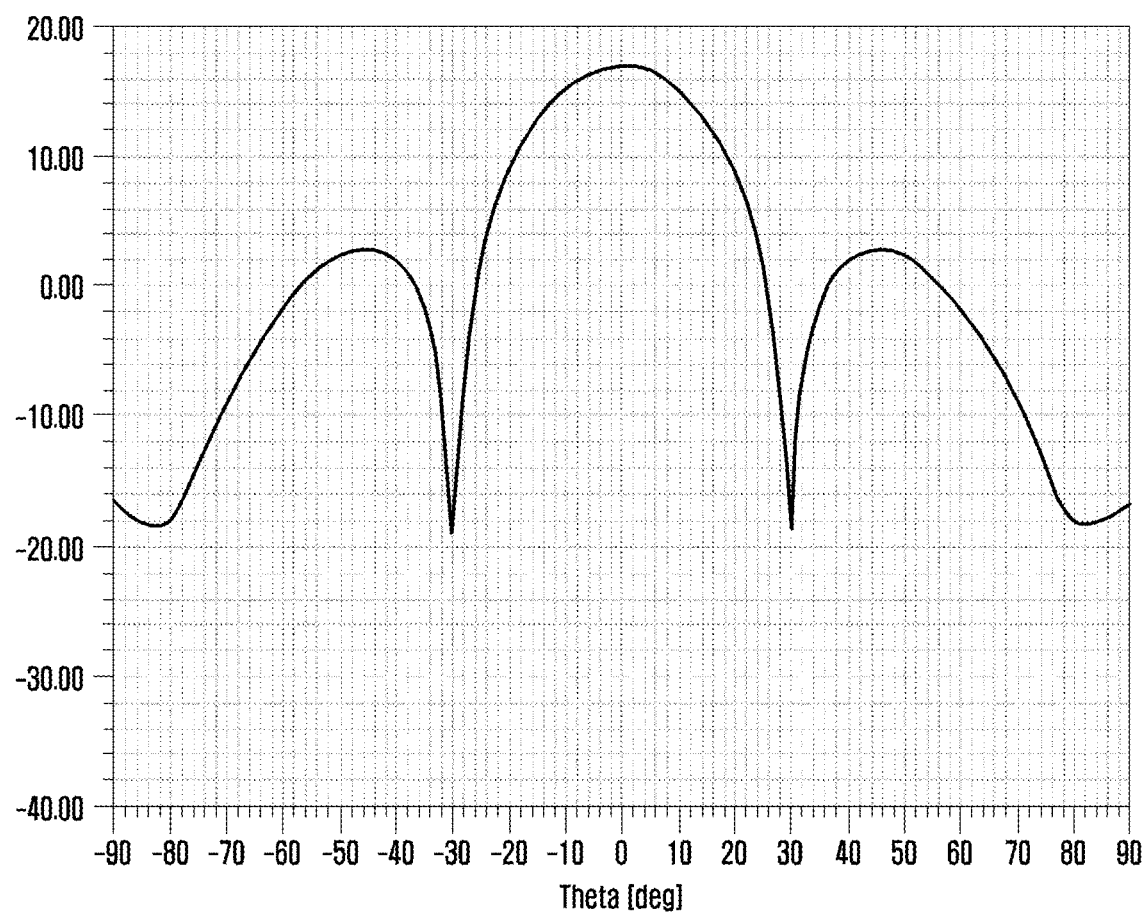
FIG. 7A is a graph illustrating gain values of an antenna module including 16 antenna arrays according to an embodiment of the disclosure.

FIG. 7A is a graph illustrating gain values of an antenna module including sixteen antenna arrays according to an embodiment of the disclosure.

According to an embodiment, when the antenna module includes 16 antenna arrays, a gain value (a gain value of a radio wave having a radiation angle of 0°) of the antenna may have about 16.8 dB. According to various embodiments, when the antenna module includes 16 antenna arrays, it may be determined that a gain value of radio waves radiated in a direction of a side lobe or a back lobe of the antenna module is 3 dB or less. That is, according to an antenna module structure disclosed in the disclosure (in the case of including 16 antenna arrays), the antenna module can secure a sufficient gain value in a main lobe direction and radio waves radiated in the direction of the side lobe or the back lobe can be minimized.

Figure 7B:
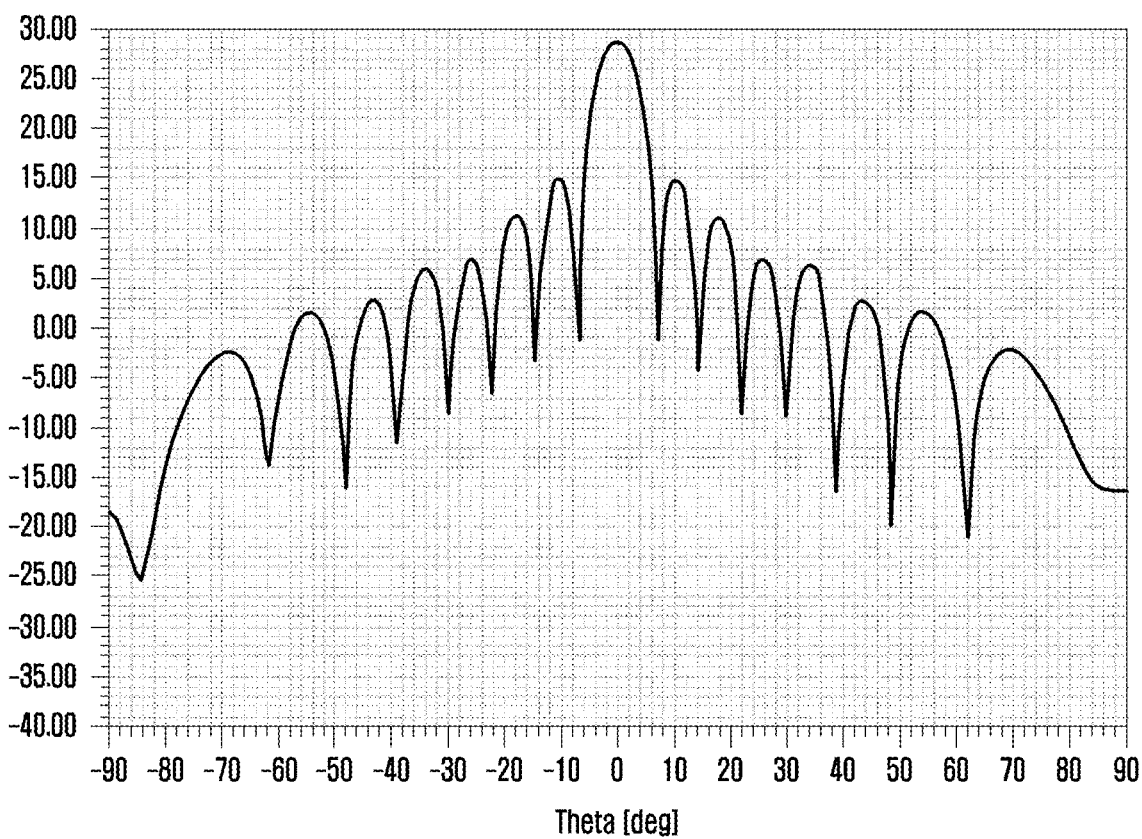
FIG. 7B is a graph illustrating gain values of an antenna module including 256 antenna arrays according to an embodiment of the disclosure.

FIG. 7B is a graph illustrating gain values of an antenna module including 256 antenna arrays according to an embodiment of the disclosure.

According to an embodiment, when the antenna module includes 256 antenna arrays, a gain value (a gain value of a radio wave having a radiation angle of 0°) of the antenna may have about 28.7 dB. According to various embodiments, when the antenna module includes 256 antenna arrays, it may be determined that a gain value of radio waves radiated in a direction of a side lobe or a back lobe of the antenna module is 7 dB or less. That is, according to an antenna module structure disclosed in the disclosure (in the case of including 256 antenna arrays), the antenna module can secure a sufficient gain value in a main lobe direction and radio waves radiated in a direction of the side lobe or the back lobe can be minimized.

Figure 8:
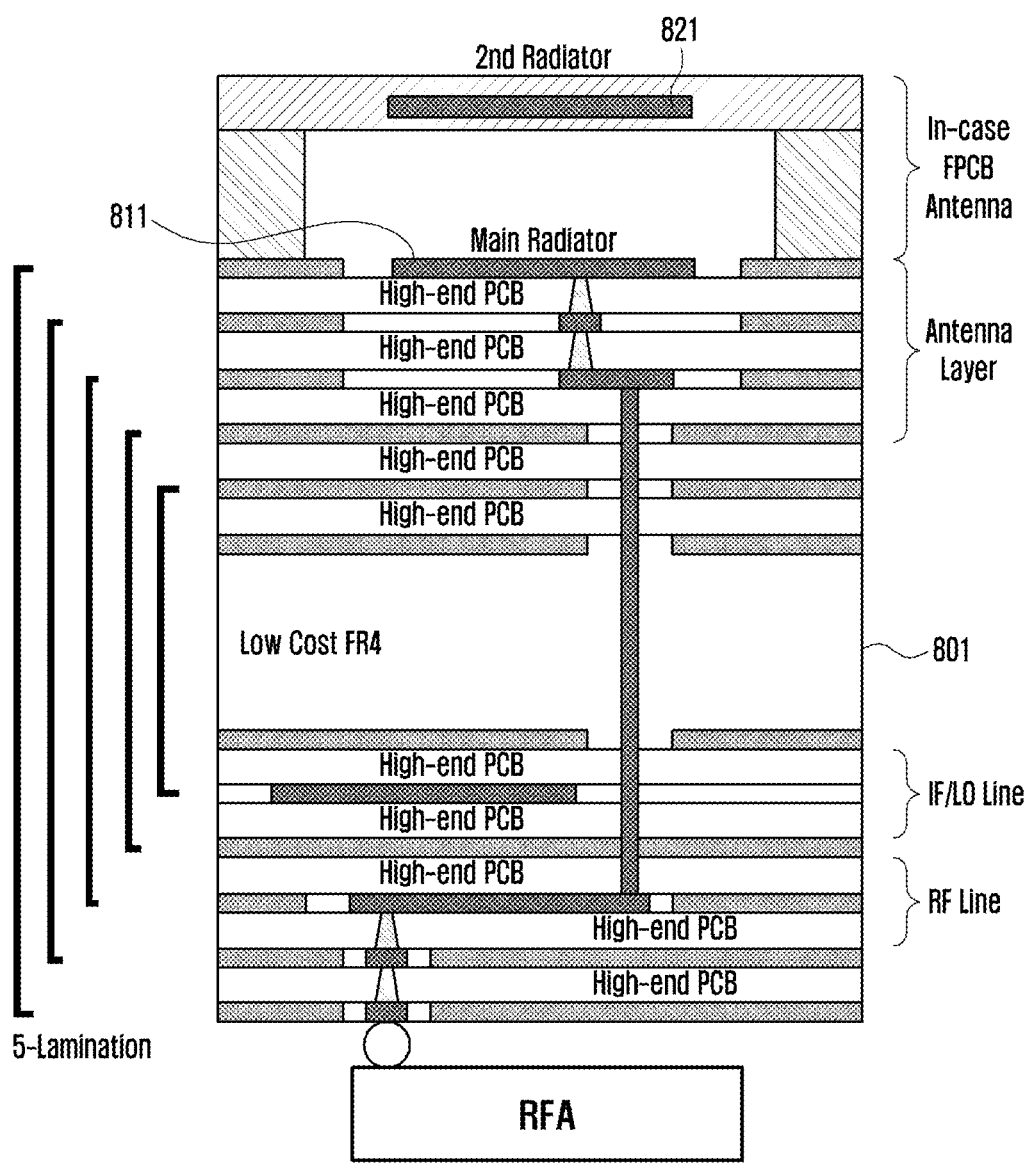
FIG. 8 is a diagram illustrating an antenna module structure according to an embodiment.

FIG. 8 is a diagram illustrating an antenna module structure according to an embodiment.

According to an embodiment, the antenna module may include a printed circuit board 801 in which a plurality of layers are stacked. According to various embodiments, a via hole may be formed in each layer of a printed circuit board 801. For example, the printed circuit board 801 may include a via hole by a laser process and a via hole by a PTH process.

According to an embodiment, a first antenna 811 for radiating radio waves may be disposed at one surface of the printed circuit board 801. For example, the first antenna 811 may be disposed at a first layer stacked on an upper end surface of the printed circuit board 801. According to various embodiments, a via hole by a laser process may be formed in the first layer, and through the via hole, the first antenna 811 may receive an electrical signal for radiating radio waves.

According to one embodiment, a second antenna 821 may be disposed at one surface facing the first antenna 811. According to various embodiments, by controlling a separation distance between the first antenna 811 and the second antenna 821, a performance of the antenna module can be improved.

Figure 9:
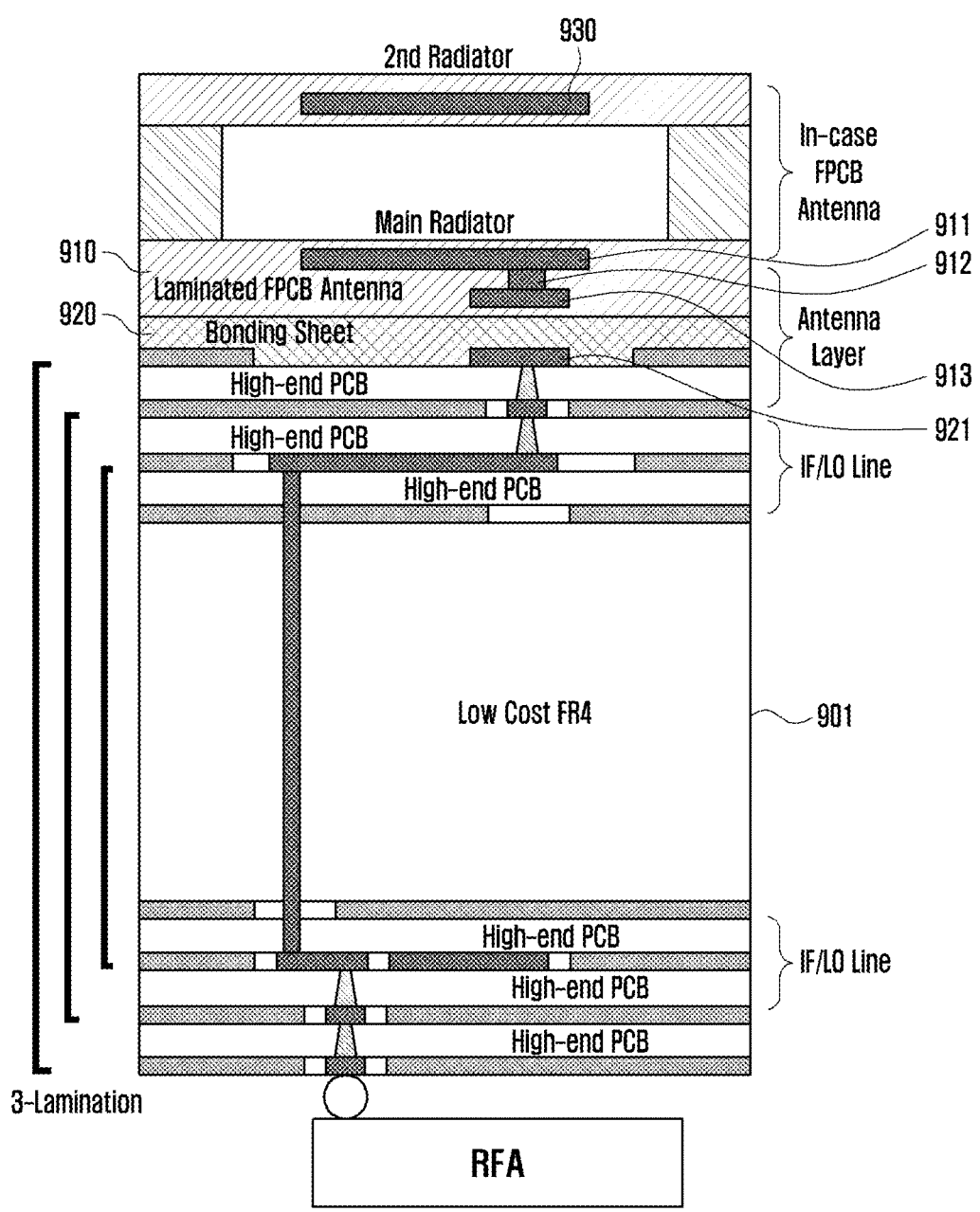
FIG. 9 is a diagram illustrating an antenna module structure according to another embodiment.

FIG. 9 is a diagram illustrating an antenna module structure according to another embodiment.

According to an embodiment, the antenna module may include a printed circuit board 901 in which a plurality of layers are stacked. According to various embodiments, a via hole may be formed in each layer of the printed circuit board 901. For example, the printed circuit board 901 may include a via hole by a laser process and a via hole by a PTH process.

According to an embodiment, at one surface of the printed circuit board 901, a first antenna 911 may be disposed at a flexible printed circuit board (FPCB) 910 laminated to radiate radio waves. For example, the laminated flexible printed circuit board 910 may include a first antenna 911, a via hole 912, and a coupling pad 913.

According to an embodiment, a bonding sheet 920 may be included between the printed circuit board 901 and the flexible printed circuit board 911. The bonding sheet 920 may include a feeding portion 921. According to various embodiments, a coupling pad 913 for receiving electric signals from the feeding portion 921 to radiate radio waves may be disposed. That is, according to the antenna module structure disclosed in the disclosure, the coupling pad 913 and a feeding portion 921 may have a coupling structure that is not directly connected. Further, according to an antenna module structure disclosed in the disclosure, the coupling pad 913 and the feeding portion 921 are a coupling structure that is not directly connected, but the flexible printed circuit board 910 may be laminated in a printed circuit board 901 to maintain a uniform distance between the coupling pad 913 and the feeding portion 921.

According to an embodiment, a second antenna 930 may be disposed. According to various embodiments, the first antenna 911 and the second antenna 930 may be spaced apart by a predetermined length by a cover made of a non-metallic material. According to an embodiment, a performance of the antenna module may be determined based on the separation distance between the first antenna 911 and the second antenna 930.

Figure 10:
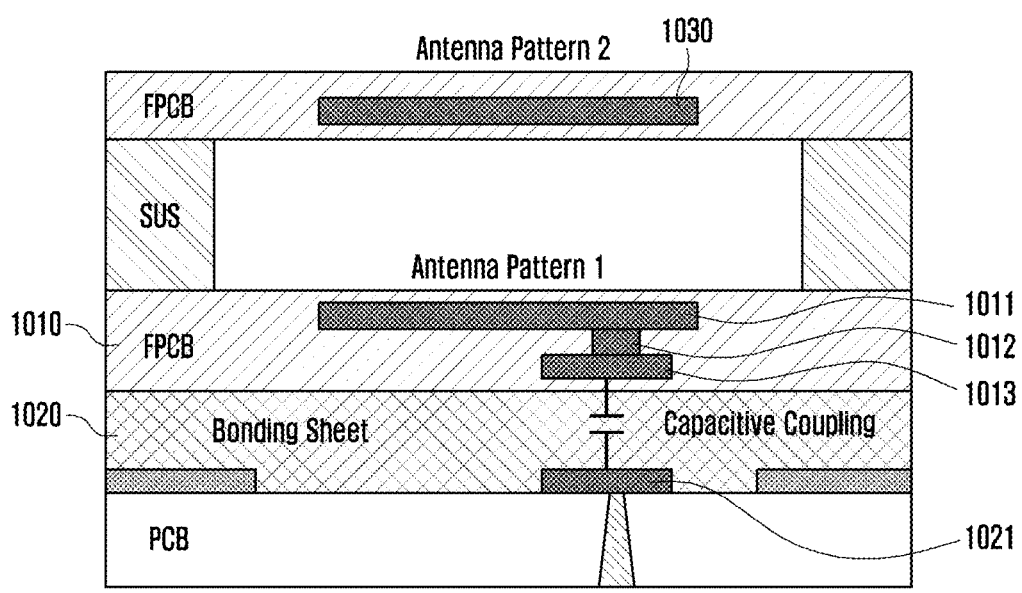
FIG. 10 is a detailed diagram illustrating an antenna module structure according to an embodiment.

FIG. 10 is a detailed diagram illustrating an antenna module structure according to an embodiment.

According to one embodiment, at one surface of a printed circuit board, a first antenna 1011 may be disposed at a flexible printed circuit board (FPCB) 1010 laminated to radiate radio waves. For example, the laminated flexible printed circuit board 1010 may include a first antenna 1011, a via hole 1012, and a coupling pad 1013. For example, the via hole 1012 may include a via hole by a laser process and a via hole by a PTH process. According to various embodiments, the via hole 1012 may be embodied with single polyimide instead of a lamination. A dielectric constant of the coupling pad 1013 may have a value between 2 and 10, and the higher a dielectric constant, the higher a coupling performance.

According to an embodiment, a bonding sheet 1020 may be included between the printed circuit board and the flexible printed circuit board 1010. The bonding sheet 1020 may include a feeding portion 1021. According to various embodiments, a coupling pad 1013 for receiving electric signals from the feeding portion 1021 to radiate radio waves may be disposed. That is, according to an antenna module structure disclosed in the disclosure, the coupling pad 1013 and the feeding portion 1021 may have a coupling structure that is not directly connected. Further, according to the antenna module structure disclosed in the disclosure, the coupling pad 1013 and the feeding portion 1021 is a coupling structure that is not directly connected, but the flexible printed circuit board 1010 may be laminated in the printed circuit board to maintain a uniform distance between the coupling pad 1013 and the feeding portion 1021. A performance of the antenna module can be improved by maintaining a uniform distance.

According to various embodiments, a coupling performance may vary depending on a dielectric constant, a thickness of the bonding material, an area of the coupling pad, and the like.

According to an embodiment, a second antenna 1030 may be disposed. According to various embodiments, the first antenna 1011 and the second antenna 1030 may be spaced apart by a predetermined length by a cover made of a non-metallic material. According to an embodiment, a performance of the antenna module may be determined based on a separation distance between the first antenna 1011 and the second antenna 1030.

Figure 11:
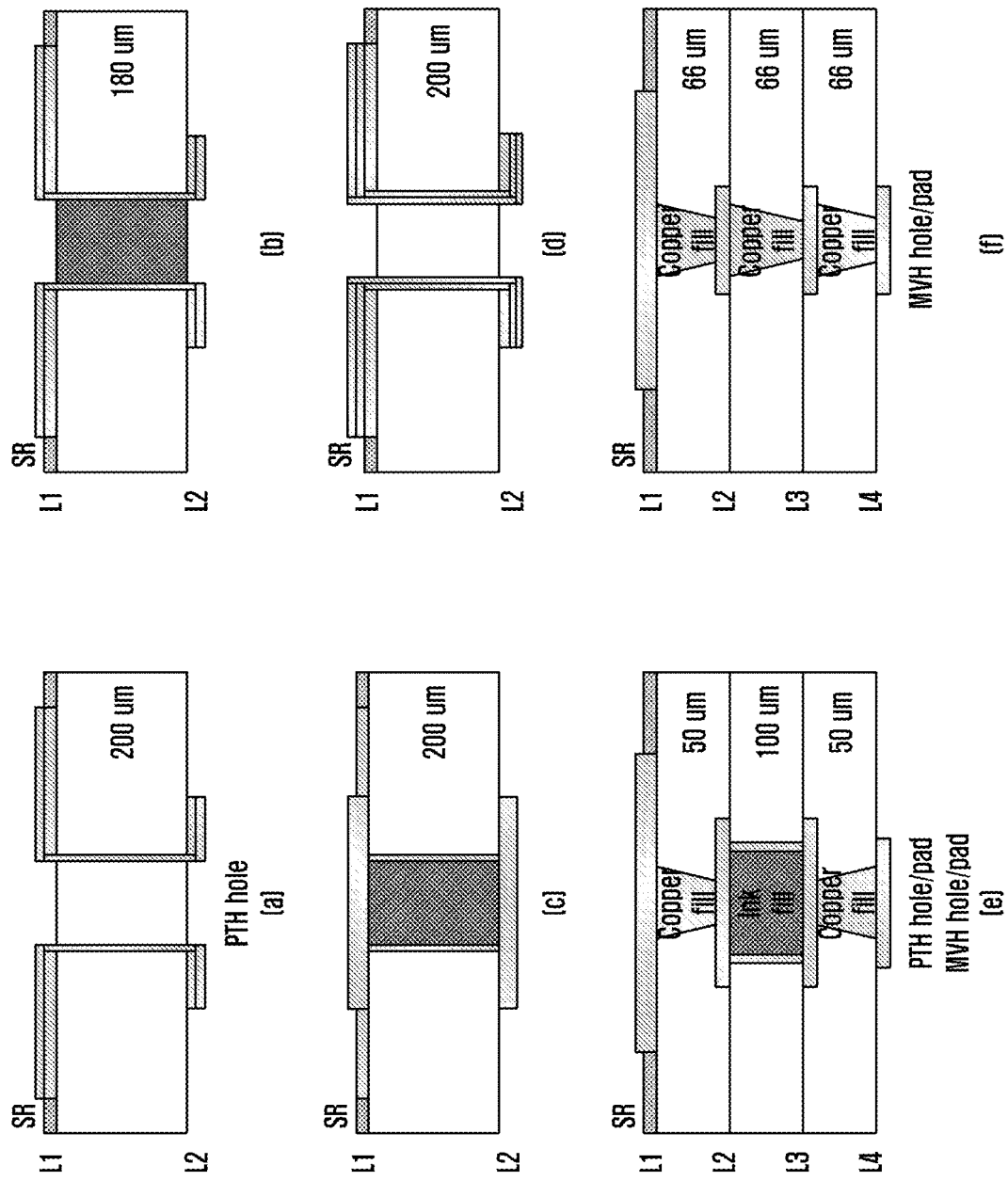
FIG. 11 is a diagram illustrating a derivation structure of an antenna module according to various embodiments.

FIG. 11 is a diagram illustrating a derivation structure of an antenna module according to various embodiments.

With reference to FIG. 11, a derivation structure of the antenna module may be derived according to a combination of a thickness, the number of plating, and a kind of a via hole. A structure (a) is a basic antenna structure and is a structure plated one time. A structure (b) is produced with a method of inserting ink into the via hole, and a structure of the via hole may be prevented from being deformed through the structure (b). A structure (c) may prevent the via hole from being deformed using a metal as well as ink. A structure (d) is a structure repeatedly plated based on the structure (a).

Structures (e) and (f) are structures derived from a multilayer structure. The structure may be changed according to the number of plating, include via holes by a laser process, and include via holes by some PTH processes.

Figure 12:
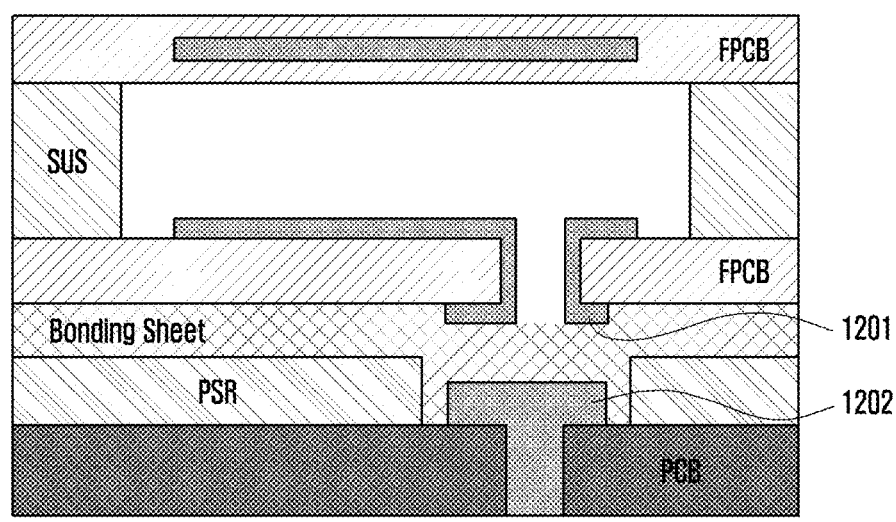
FIG. 12 is a diagram illustrating an antenna structure according to an embodiment.

FIG. 12 is a diagram illustrating an antenna structure according to an embodiment.

With reference to FIG. 12, an antenna performance may be influenced by misalignment of a coupling pad 1201 of a flexible printed circuit board and a feeding portion 1202 of a bonding sheet. When misalignment of the coupling pad 1201 and the feeding portion 1202 occurs, a gain value may be changed. According to various embodiments, as misalignment increases, a coupling performance may decrease. According to various embodiments, in the case of 0.15 mm or more, deterioration of a gain value may start. Specifically, in the disclosure, it is characterized in that misalignment of the coupling pad 1201 and the feeding portion 1202 of the bonding sheet is 2 mm or less.

Figure 13:
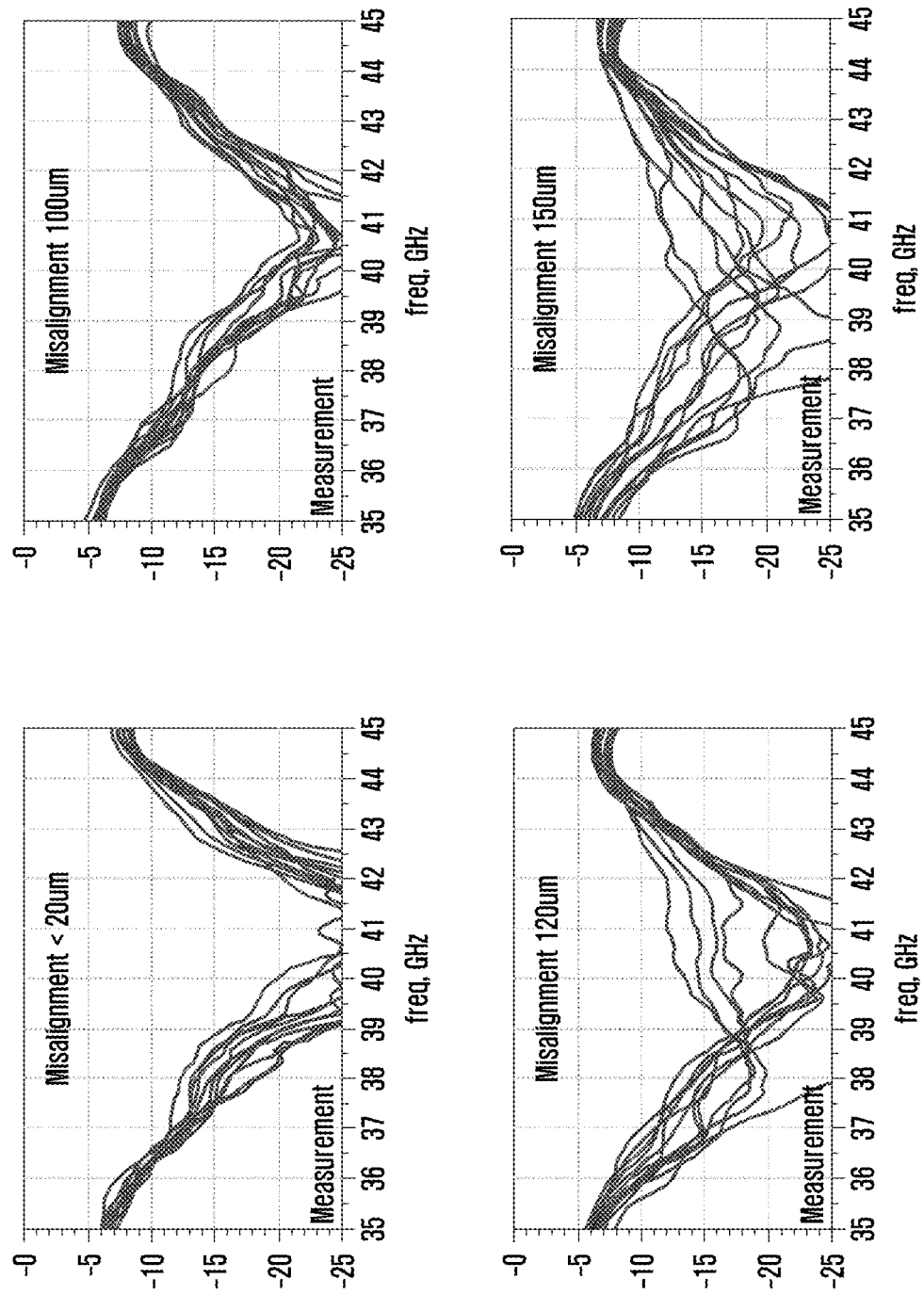
FIG. 13 is a diagram illustrating a change in a gain value according to an embodiment.

FIG. 13 is a diagram illustrating a change in a gain value according to an embodiment.

With reference to FIG. 13, when misalignment occurs as illustrated in FIG. 12, a gain value may change. That is, when misalignment is 20 μm or less, there is no significant change in performance, but when misalignment is 150 μm, deterioration of the gain value may start.

According to an embodiment, an antenna module including a printed circuit board may include the printed circuit board in which at least one layer is stacked; a feeding unit disposed at one surface of the printed circuit board; and a first antenna spaced apart from the feeding unit by a predetermined first length.

According to an embodiment, the antenna module may further include a dielectric layer stacked on one surface of the printed circuit board in which the feeding unit is disposed; and a first flexible printed circuit board (FPCB) stacked on one surface of the dielectric layer, wherein the first antenna may be disposed at one surface of the first FPCB.

According to an embodiment, the antenna module may further include a second FPCB spaced apart from one surface of the first FPCB by a predetermined second length; a second antenna disposed at one surface of the second FPCB; and a structure disposed at one surface of the first FPCB to enable the first FPCB and the second FPCB to be spaced apart by the second length.

According to an embodiment, the printed circuit board may include a first layer disposed at one surface of the printed circuit board; a second layer stacked under the first layer; a third layer disposed at the other surface of the printed circuit board; a fourth layer stacked over the third layer; and at least one layer disposed between the second layer and the fourth layer, wherein laser via holes may be formed in the first layer, the second layer, the third layer, and the fourth layer, and via holes by a plated through hole (PTH) process may be formed in the at least one layer.

According to an embodiment, the antenna module may further include a wireless communication chip disposed at the other surface of the printed circuit board, wherein electrical signals supplied from the wireless communication chip may be transmitted to the feeding unit.

According to an embodiment, electrical signals supplied from the wireless communication chip may be transmitted to the feeding unit through laser via holes formed in the first layer, the second layer, the third layer, and the fourth layer and via holes formed by the PTH process.

According to an embodiment, in order to generate a radio frequency radiated through the first antenna, intermediate frequency signals and local frequency signals supplied from the other surface of the printed circuit board may be transmitted to one surface of the third layer through laser via holes formed in the third layer and the fourth layer.

According to an embodiment, the antenna module may further include a fifth layer stacked under the second layer, wherein the laser via hole may be formed in the fifth layer, and a ground may be disposed at one surface of the fifth layer.

According to an embodiment, one surface of the structure and the first FPCB may be coupled through a first adhesive layer, and the other surface of the structure and the second FPCB may be coupled through a second adhesive layer.

According to an embodiment, the first length may be determined based on a wavelength of radio waves radiated through the first antenna.

According to an embodiment, a base station may include an antenna module, wherein the antenna module may include a printed circuit board in which at least one layer is stacked; a feeding unit disposed at one surface of the printed circuit board; and a first antenna spaced apart from the feeding unit by a predetermined first length.

According to an embodiment, the antenna module may further include a dielectric layer stacked on one surface of the printed circuit board in which the feeding unit is disposed; and a first flexible printed circuit board (FPCB) stacked on one surface of the dielectric layer, wherein the first antenna may be disposed at one surface of the first FPCB.

According to an embodiment, the antenna module may further include a second FPCB spaced apart from one surface of the first FPCB by a predetermined second length; a second antenna disposed at one surface of the second FPCB; and a structure disposed at one surface of the first FPCB to enable the first FPCB and the second FPCB to be spaced apart by the second length.

According to an embodiment, the printed circuit board may include a first layer disposed at one surface thereof; a second layer stacked under the first layer; a third layer disposed at the other surface of the printed circuit board; a fourth layer stacked over the third layer; and at least one layer disposed between the second layer and the fourth layer, wherein laser via holes may be formed in the first layer, the second layer, the third layer, and the fourth layer, and via holes by a plated through hole (PTH) process may be formed in the at least one layer.

According to an embodiment, the antenna module may further include a wireless communication chip disposed at the other surface of the printed circuit board, and wherein electrical signals supplied from the wireless communication chip may be transmitted to the feeding unit.

According to an embodiment, electrical signals supplied from the wireless communication chip may be transmitted to the feeding unit through laser via holes formed in the first layer, the second layer, the third layer, and the fourth layer and via holes formed by the PTH process.

According to an embodiment, in order to generate a radio frequency radiated through the first antenna, intermediate frequency signals and local frequency signals supplied from the other surface of the printed circuit board may be transmitted to one surface of the third layer through laser via holes formed in the third layer and the fourth layer.

According to an embodiment, the antenna module may further include a fifth layer stacked under the second layer, and wherein the laser via hole may be formed in the fifth layer, and a ground may be disposed at one surface of the fifth layer.

According to an embodiment, one surface of the structure and the first FPCB may be coupled through a first adhesive layer, and the other surface of the structure and the second FPCB may be coupled through a second adhesive layer.

According to an embodiment, the first length may be determined based on a wavelength of radio waves radiated through the first antenna.

According to an embodiment disclosed in the disclosure, by reducing the stacking number of layers in a production process of a printed circuit board constituting an antenna module, a performance of the antenna module can be improved, a failure rate of the antenna module can be reduced, and a time and cost consumed for production of the antenna module can be reduced.

Further, according to an embodiment disclosed in the disclosure, by supplying an electrical signal indirectly, as in a coupling scheme to an antenna constituting the antenna module, design freedom of the antenna module can be improved.

Although the present disclosure has been described with various embodiments, various changes and modifications may be suggested to one skilled in the art. It is intended that the present disclosure encompass such changes and modifications as fall within the scope of the appended claims.

What is claimed is:

1. An antenna module comprising a printed circuit board 401, the antenna module comprising:
   the printed circuit board in which at least one layer is stacked;
   a feeding unit disposed at one surface of the printed circuit board;
   a first antenna electrically coupled to the feeding unit, wherein the first antenna is physically disconnected from and is spaced apart from the feeding unit by a predetermined first length,
   a dielectric layer stacked on the one surface of the printed circuit board in which the feeding unit is disposed;
   a second flexible printed circuit board (FPCB) spaced apart from a first FPCB by a predetermined second length;
   a second antenna disposed on the second FPCB; and
   a structure disposed on the first FPCB to space the first FPCB and the second FPCB apart by the second length,
   wherein the first antenna is disposed on the first FPCB, and the first FPCB is disposed on an upper surface of the printed circuit board, and
   wherein the first FPCB is stacked on the dielectric layer.

2. The antenna module of claim 1, wherein the printed circuit board comprises:
   a first layer disposed at a first surface of the printed circuit board;
   a second layer stacked under the first layer;
   a third layer disposed at a second surface of the printed circuit board;
   a fourth layer stacked over the third layer; and
   at least one intermediate layer disposed between the second layer and the fourth layer,
   wherein:
      the first layer, the second layer, the third layer, and the fourth layer each include laser via holes, and
      the at least one intermediate layer includes via holes formed by a plated through hole (PTH) process.

3. The antenna module of claim 2, further comprising a wireless communication chip disposed at the second surface of the printed circuit board,
   wherein electrical signals supplied from the wireless communication chip are transmitted to the feeding unit.

4. The antenna module of claim 3, wherein electrical signals supplied from the wireless communication chip are transmitted to the feeding unit through the laser via holes formed in the first layer, the second layer, the third layer, and the fourth layer and through the via holes formed by the PTH process.

5. The antenna module of claim 2, wherein:
   intermediate frequency signals and local frequency signals supplied from the second surface of the printed circuit board are transmitted to one surface of the third layer through the laser via holes formed in the third layer and the fourth layer in order to generate a radio frequency, and
   the radio frequency is radiated through the first antenna.

6. The antenna module of claim 2, further comprising a fifth layer stacked under the second layer,
   wherein the fifth layer includes a laser via hole, and
   a ground is disposed at one surface of the fifth layer.

7. The antenna module of claim 1, wherein:
   a first surface of the structure is coupled to the first FPCB through a first adhesive layer, and
   a second surface of the structure is coupled to the second FPCB through a second adhesive layer.

8. The antenna module of claim 1, wherein the first length is determined based on a wavelength of radio waves radiated through the first antenna.

9. A base station comprising an antenna module, wherein the antenna module comprises:
   a printed circuit board in which at least one layer is stacked;
   a feeding unit disposed at one surface of the printed circuit board;
   a first antenna electrically coupled to the feeding unit, wherein the first antenna is physically disconnected from and is spaced apart from the feeding unit by a predetermined first length,
   wherein the first antenna is disposed on a first printed circuit board (FPCB), and the first FPCB is disposed on an upper surface of the printed circuit board;
   a dielectric layer stacked on the one surface of the printed circuit board in which the feeding unit is disposed;
   a second FPCB spaced apart from the first FPCB by a predetermined second length;
   a second antenna disposed on the second FPCB; and
   a structure disposed on the first FPCB to space the first FPCB and the second FPCB apart by the second length, and
   wherein the first FPCB is stacked on the dielectric layer.

10. The base station of claim 9, wherein the printed circuit board comprises:
    a first layer disposed at a first surface of the printed circuit board;
    a second layer stacked under the first layer;
    a third layer disposed at a second surface of the printed circuit board;
    a fourth layer stacked over the third layer; and
    at least one intermediate layer disposed between the second layer and the fourth layer, wherein:
the first layer, the second layer, the third layer, and the fourth layer each include laser via holes, and
the at least one intermediate layer includes via holes formed by a plated through hole (PTH) process.

11. The base station of claim 10, wherein the antenna module further comprises a wireless communication chip disposed at the second surface of the printed circuit board, and
wherein electrical signals supplied from the wireless communication chip are transmitted to the feeding unit.

12. The base station of claim 11, wherein electrical signals supplied from the wireless communication chip are transmitted to the feeding unit through the laser via holes formed in the first layer, the second layer, the third layer, and the fourth layer and through the via holes formed by the PTH process.

13. The base station of claim 10, wherein:
intermediate frequency signals and local frequency signals supplied from the second surface of the printed circuit board are transmitted to one surface of the third layer through the laser via holes formed in the third layer and the fourth layer in order to generate a radio frequency, and
the radio frequency is radiated through the first antenna.

14. The base station of claim 10, wherein:
the antenna module further comprises a fifth layer stacked under the second layer,
the fifth layer includes a laser via hole, and
a ground is disposed at one surface of the fifth layer.

15. The base station of claim 9, wherein:
a first surface of the structure is coupled to the first FPCB through a first adhesive layer, and
a second surface of the structure is coupled to the second FPCB through a second adhesive layer.

16. The base station of claim 9, wherein the first length is determined based on a wavelength of radio waves radiated through the first antenna.

* * * * *